United States Patent
Yamamoto et al.

(10) Patent No.: US 7,994,513 B2
(45) Date of Patent: Aug. 9, 2011

(54) SILICON CARBIDE SEMICONDUCTOR DEVICE INCLUDING DEEP LAYER

(75) Inventors: Kensaku Yamamoto, Chiryu (JP); Eiichi Okuno, Mizuho (JP)

(73) Assignee: DENSO CORPORATION, Kariya (JP)

( * ) Notice: Subject to any disclaimer, the term of this patent is extended or adjusted under 35 U.S.C. 154(b) by 95 days.

(21) Appl. No.: 12/385,715

(22) Filed: Apr. 16, 2009

(65) Prior Publication Data
US 2009/0261350 A1    Oct. 22, 2009

(30) Foreign Application Priority Data
Apr. 17, 2008    (JP) .................................. 2008-107820

(51) Int. Cl.
*H01L 21/02*    (2006.01)
(52) U.S. Cl. ... 257/77; 257/328; 257/335; 257/E21.054; 257/E29.069; 257/E29.346
(58) Field of Classification Search ............ 257/77, 257/133, 328–342, E21.218, 252, 345, 23.033, 257/69, 29.04, 21, 104, 174, 175, 301, 409, 257/492, 493, E21.054, 29.169, 346
See application file for complete search history.

(56) References Cited

U.S. PATENT DOCUMENTS

| | | | | |
|---|---|---|---|---|
| 5,322,802 A * | 6/1994 | Baliga et al. | ................... | 438/268 |
| 5,637,898 A * | 6/1997 | Baliga | ........................... | 257/330 |
| 5,744,826 A | 4/1998 | Takeuchi et al. | | |
| 5,969,378 A * | 10/1999 | Singh | ............................. | 257/77 |
| 6,057,558 A | 5/2000 | Yamamoto et al. | | |
| 6,133,587 A | 10/2000 | Takeuchi et al. | | |
| 7,091,573 B2 * | 8/2006 | Hirler et al. | ..................... | 257/500 |
| 7,345,342 B2 * | 3/2008 | Challa et al. | .................... | 257/341 |
| 7,504,690 B2 * | 3/2009 | Kelly et al. | .................... | 257/328 |
| 7,652,326 B2 * | 1/2010 | Kocon | ........................... | 257/328 |
| 7,732,821 B2 * | 6/2010 | Suzuki et al. | .................... | 257/77 |
| 7,824,995 B2 * | 11/2010 | Endo et al. | ..................... | 438/308 |
| 7,825,449 B2 * | 11/2010 | Suzuki et al. | ................. | 257/301 |
| 2002/0185705 A1 | 12/2002 | Saitoh et al. | | |
| 2004/0056306 A1 | 3/2004 | Saito et al. | | |
| 2004/0094819 A1 | 5/2004 | Saitoh et al. | | |

(Continued)

FOREIGN PATENT DOCUMENTS

JP    A-11-17176    1/1999

OTHER PUBLICATIONS

Notice of Reasons for Refusal mailed Jun. 15, 2010 in a corresponding Japanese Application No. 2008-107820.

(Continued)

*Primary Examiner* — Michael S Lebentritt
(74) *Attorney, Agent, or Firm* — Posz Law Group, PLC

(57) ABSTRACT

A silicon carbide semiconductor device includes a substrate, a drift layer located on a first surface of the substrate, a base region located on the drift layer, a source region located on the base region, a trench sandwiched by each of the base region to the drift layer, a channel layer located in the trench, a gate insulating layer located on the channel layer, a gate electrode located on the gate insulating layer, a source electrode electrically coupled with the source region and the base region, a drain electrode located on a second surface of the substrate, and a deep layer located under the base region and extending to a depth deeper than the trench. The deep layer is formed into a lattice pattern.

9 Claims, 18 Drawing Sheets

U.S. PATENT DOCUMENTS

| | | |
|---|---|---|
| 2005/0167742 A1* | 8/2005 | Challa et al. ............... 257/328 |
| 2005/0181536 A1* | 8/2005 | Tsuji ............................ 438/105 |
| 2006/0001084 A1* | 1/2006 | Kelly et al. .................. 257/329 |
| 2006/0006458 A1* | 1/2006 | Motai et al. .................. 257/330 |
| 2006/0057796 A1* | 3/2006 | Harada et al. ................ 438/199 |
| 2007/0194375 A1 | 8/2007 | Kawaguchi et al. |
| 2008/0099837 A1 | 5/2008 | Akiyama et al. |
| 2008/0280412 A1* | 11/2008 | Tsuji ............................ 438/285 |
| 2009/0072241 A1 | 3/2009 | Harris et al. |
| 2009/0200559 A1* | 8/2009 | Suzuki et al. ................. 257/77 |
| 2009/0311839 A1* | 12/2009 | Miyahara et al. ............ 438/270 |

OTHER PUBLICATIONS

Office Action mailed Dec. 7, 2010 in related U.S. Appl. No. 12/379,076.

Office Action dated Apr. 12, 2011, from USPTO in corresponding U.S. Appl. No. 12/379,076.

* cited by examiner

SILICON CARBIDE SEMICONDUCTOR DEVICE INCLUDING DEEP LAYER

CROSS REFERENCE TO RELATED APPLICATIONS

The present application is based on and claims priority to Japanese Patent Application No. 2008-107820 filed on Apr. 17, 2008, the contents of which are incorporated in their entirety herein by reference.

BACKGROUND OF THE INVENTION

1. Field of the Invention

The present invention relates to a silicon carbide semiconductor device including a deep layer.

2. Description of the Related Art

A silicon carbide (SiC) semiconductor device typically has a high breakdown field strength and can therefore control a high current. The SiC semiconductor device can be used for controlling a motor of a hybrid vehicle, for example.

In order to increase electric current that flows in a semiconductor device, a channel density can be increased. In a silicon semiconductor device, a metal-oxide semiconductor field-effect transistor (MOSFET) having a trench gate structure is in practical use. When a trench gate structure is applied to the SiC semiconductor device, difficulty arises. The breakdown field strength of SiC is about ten times greater than a breakdown field strength of silicon. Thus, a voltage about ten times greater than a voltage applied to the silicon semiconductor device may be applied to the SiC semiconductor device. If such a voltage is applied, a gate insulating layer disposed in a plurality of trenches provided in an SiC substrate may receive an electric field about ten times greater than an electric field in the silicon semiconductor device. As a result, the gate insulating layer may be damaged, for example, at a corner portion of each of the trenches. According to a simulation by the inventors named in the present application, when a voltage of about 650 V is applied to a drain, the gate insulating layer in the trenches receives an electric field of about 4.9 MV/cm. The electric filed applied to the gate insulating layer is required to be about 3 MV/cm or less for practical use. Furthermore, the electric filed applied to the gate insulating layer is required to be about 2 MV/cm or less for long-term use.

In an SiC semiconductor device described in U.S. Pat. No. 5,744,826 (corresponding to JP-A-9-199724), a thickness of an gate insulating layer located at a bottom portion of each of the trenches is set to be greater than a thickness of the gate insulating layer located at a sidewall of each of the trenches for reducing an electric field concentration at the bottom portion of each of the trenches. The SiC semiconductor device described in U.S. Pat. No. 5,744,826 is made of a 4H-SiC substrate having a main surface of (000-1)-face and the trenches extend in a (1120)-direction. An oxidation rate of the (000-1)-face is about five times greater than an oxidation rate of the (1120)-face. Thus, when a gate insulation layer is formed by thermal oxidation in the trenches that have a sidewall of (1120)-face and a bottom of (000-1)-face, a thickness of an oxide layer formed at the bottom portion can be about five times greater than a thickness of the oxide layer formed on the sidewall. Thereby, the electric field concentration at the bottom portion of the trenches can be reduced.

According to another simulation by the inventors, in which a thickness of the gate insulating layer on the sidewall is set to be about 40 nm and the thickness of gate insulation layer at the bottom portion is set to be about 200 nm, when a voltage of about 650 V is applied to a drain, the electric field concentration at the gate insulating layer in the trenches can be reduced to about 3.9 MV/cm. However, further relaxation of the electric field is required.

U.S. patent application Ser. No. 12/289,624 filed on Oct. 29, 2008 (corresponding to Japanese Patent Application No. 2007-288545) and made by one of the present inventers describes an SiC semiconductor device including P type deep layers formed along a longitudinal direction of a trench gate. The P type deep layers are located on an opposite side of an N+ type source region and a P type base region from the trench gate. The P type deep layers are located under a P+ type contact region for electrically coupling the P type base region and a source electrode. The P type deep layers extend to a depth deeper than a bottom portion of the trench gate. In the SiC semiconductor device described therein, the electric field can be further relaxed.

In a manufacturing process of the above-described SiC semiconductor device, the trench gate and the P type deep layers are formed during different processes. Thus, a positioning is difficult, and a distance between a sidewall of the trench and the P type deep layer may vary. As a result, a production property may vary and a yield may be reduced.

Japanese Patent Application No. 2008-31704 made by one of the present inventers describes an SiC semiconductor device including P type deep layers formed along an approximately normal direction of a sidewall of a trench where a channel region is provided. In such a configuration, a depletion layer expands toward an N− type drift layer at a PN junction between P type deep layers and the N− type drift layer. Thus, a high voltage due to a drain voltage is restricted from being applied to a gate oxide layer. Thereby, an electric field concentration in the gate oxide layer, especially, an electric field concentration in the gate oxide layer at a bottom portion of the trench can be reduced. In addition, a longitudinal direction of the trench and a longitudinal direction of the deep layers are approximately perpendicular to each other. Thus, a device property is not affected by a misalignment of masks.

In the above-described configuration, the P type deep layers are arranged parallel to each other in a stripe pattern. Thus, the P type deep layers are separated from each other. When a breakdown occurs, electric current may concentrates in one of the P type deep layers. Thus, an imbalance of the electric current may occur and an element may be damaged due to an electric current concentration.

SUMMARY OF THE INVENTION

In view of the foregoing problems, it is an object of the present invention to provide a silicon carbide semiconductor device including a deep layer that can restrict an imbalance of electric current flowing at a breakdown.

A silicon carbide semiconductor device according to a first aspect of the present invention includes a substrate, a drift layer, a base region, a source region, a trench, a channel layer, a gate insulating layer, a gate electrode, a source electrode, a drain electrode, and a deep layer. The substrate is made of silicon carbide. The substrate has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The base region is located on the drift layer. The base region is made of silicon carbide and has the second conductivity type. The source region is located on the base region. The source region is made of silicon carbide. The source region has the first conductive type and has an impurity concentration greater than the impurity concentration of the drift layer. The trench extends to a depth deeper than the base region and the source region. The trench is sandwiched by each of the base region and source region. The channel layer is located on a sidewall of the trench. The channel layer is made of silicon carbide and has the first conductivity type. The gate insulating layer is located on a surface of the channel layer so as to be apart from the base region. The gate electrode is located on the gate insulating layer in the trench. The source electrode is electrically coupled with the source region and the base region. The drain electrode is located on the second surface of the substrate. The deep layer is located under the base region and extends to a depth deeper than the trench. The deep layer has the second conductivity type. The deep layer is formed into a lattice pattern in such a manner that sections of the deep layer are formed along a first direction, the other sections of the deep layer are formed along a second direction, and the first direction and second direction are inclined at an approximately same angle to the sidewall of the trench in opposite directions. An accumulation channel is provided at the channel layer on the sidewall of the trench and electric current flows between the source electrode and the drain electrode through the source region and the drift layer by controlling a voltage applied to the gate electrode.

In the present silicon carbide semiconductor device, the deep layer is formed into the lattice pattern and all the sections of the deep layer are coupled with each other. Thus, even if the breakdown occurs, electric current disperses widely in the deep layer and an imbalance of the electric current can be restricted. Therefore, elements can be restricted from being broken due to an electric current concentration.

A silicon carbide semiconductor device according to a second aspect of the present invention includes a substrate, a drift layer, a base region, a source region, a trench, a channel layer, a gate insulating layer, a gate electrode, a source electrode, a drain electrode, and a deep layer. The substrate is made of silicon carbide. The substrate has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The base region is located on the drift layer. The base region is made of silicon carbide and has the second conductivity type. The source region is located on the base region. The source region is made of silicon carbide. The source region has the first conductive type and has an impurity concentration greater than the impurity concentration of the drift layer. The trench extends to a depth deeper than the base region and the source region. The trench is sandwiched by each of the base region and source region. The channel layer is located on a sidewall of the trench. The channel layer is made of silicon carbide and has the first conductivity type. The gate insulating layer is located on a surface of the channel layer so as to be apart from the base region. The gate electrode is located on the gate insulating layer in the trench. The source electrode is electrically coupled with the source region and the base region. The drain electrode is located on the second surface of the substrate. The deep layer is located under the base region and extends to a depth deeper than the trench. The deep layer has the second conductivity type. The deep layer is formed into a honeycomb pattern including a plurality of hexagonal shapes. A diagonal line passing through a center of each of the hexagonal shape is approximately perpendicular to the sidewall of the trench. An accumulation channel is provided at the channel layer on the sidewall of the trench and electric current flows between the source electrode and the drain electrode through the source region and the drift layer by controlling a voltage applied to the gate electrode.

In the present silicon carbide semiconductor device, the deep layer is formed into the honeycomb pattern and all the sections of the deep layer are coupled with each other. Thus, even if the breakdown occurs, electric current disperses widely in the deep layer and an imbalance of the electric current can be restricted. Therefore, elements can be restricted from being broken due to an electric current concentration.

A silicon carbide semiconductor device according to a third aspect of the present invention includes a substrate, a drift layer, a base region, a source region, a trench, a gate insulating layer, a gate electrode, a source electrode, a drain electrode, and a deep layer. The substrate is made of silicon carbide. The substrate has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The base region is located on the drift layer. The base region is made of silicon carbide and has the second conductivity type. The source region is located on the base region. The source region is made of silicon carbide. The source region has the first conductive type and has an impurity concentration greater than the impurity concentration of the drift layer. The trench extends to a depth deeper than the base region and the source region. The trench is sandwiched by each of the base region and source region. The gate insulating layer is located on a surface of the trench. The gate electrode is located on the gate insulating layer in the trench. The source is electrode electrically coupled with the source region and the base region. The drain electrode is located on the second surface of the substrate. The deep layer is located under the base region and extends to a depth deeper than the trench. The deep layer has the second conductivity type. The deep layer is formed into a lattice pattern in such a manner that sections of the deep layer are formed along a first direction, the other sections of the deep layer are formed along a second direction, and the first direction and second direction are inclined at an approximately same angle to the sidewall of the trench in opposite directions. An inversion channel is provided at a surface portion of the base region located on a sidewall of the trench and electric current flows between the source electrode and the drain electrode through the source region and the drift layer by controlling a voltage applied to the gate electrode.

In the present silicon carbide semiconductor device, the deep layer is formed into the lattice pattern and all the sections of the deep layer are coupled with each other. Thus, even if the breakdown occurs, electric current disperses widely in the deep layer and an imbalance of the electric current can be restricted. Therefore, elements can be restricted from being broken due to an electric current concentration.

A silicon carbide semiconductor device according to a third aspect of the present invention includes a substrate, a drift layer, a base region, a source region, a trench, a gate insulating layer, a gate electrode, a source electrode, a drain electrode, and a deep layer. The substrate is made of silicon carbide. The substrate has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The base region is located on the drift layer. The base region is made of silicon carbide and has the second conductivity type. The source region is located on the base region. The source region is made of silicon carbide. The source region has the first conductive type and has an impurity concentration greater than the impurity concentration of the drift layer. The trench extends to a depth deeper than the base region and the source region. The trench is sandwiched by each of the base region and source region. The gate insulating layer is located on a surface of the trench. The gate electrode is located on the gate insulating layer in the trench. The source electrode is electrically coupled with the source region and the base region. The drain electrode is located on the second surface of the substrate. The deep layer is located under the base region and extending to a depth deeper than the trench. The deep layer has the second conductivity type. The deep layer is formed into a honeycomb pattern including a plurality of hexagonal shapes. A diagonal line passing through a center of the hexagonal shape is approximately perpendicular to the sidewall of the trench. The inversion channel is provided at a surface portion of the base region located on a sidewall of the trench and electric current flows between the source electrode and the drain electrode through the source region and the drift layer by controlling a voltage applied to the gate electrode.

In the present silicon carbide semiconductor device, the deep layer is formed into the honeycomb pattern and all the sections of the deep layer are coupled with each other. Thus, even if the breakdown occurs, electric current disperses widely in the deep layer and an imbalance of the electric current can be restricted. Therefore, elements can be restricted from being broken due to an electric current concentration.

BRIEF DESCRIPTION OF THE DRAWINGS

Additional objects and advantages of the present invention will be more readily apparent from the following detailed description of exemplary embodiments when taken together with the accompanying drawings. In the drawings.

DETAILED DESCRIPTION OF THE EXEMPLARY EMBODIMENTS

First Embodiment

An SiC semiconductor device according to a first embodiment of the present invention will now be described with reference to FIG. 1 to FIG. 2D. The SiC semiconductor device includes a plurality of accumulation-type MOSFETs, for example.

Figure 1:
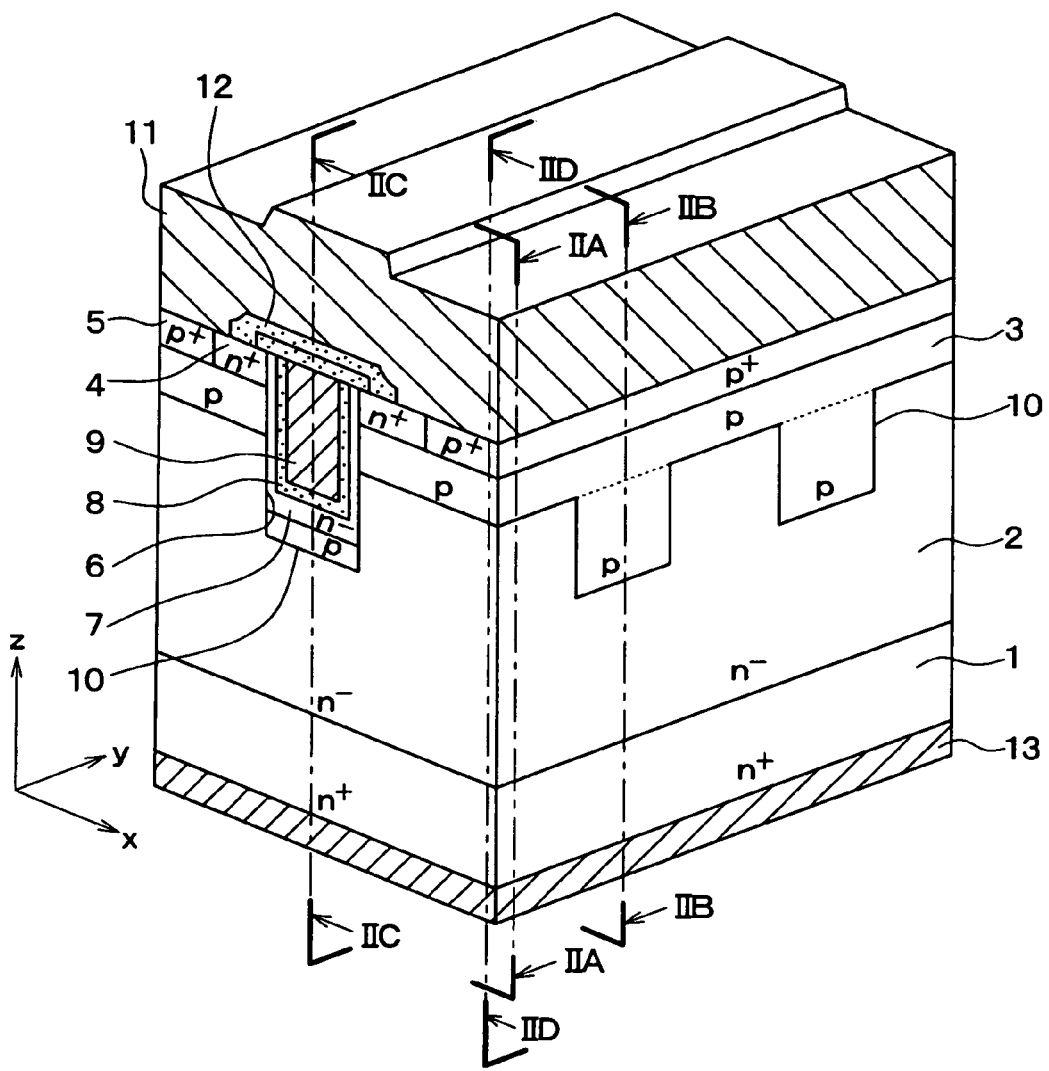
FIG. 1 is a diagram illustrating a perspective cross-sectional view of a MOSFET in an SiC semiconductor device according to a first embodiment.
Figure 2A:
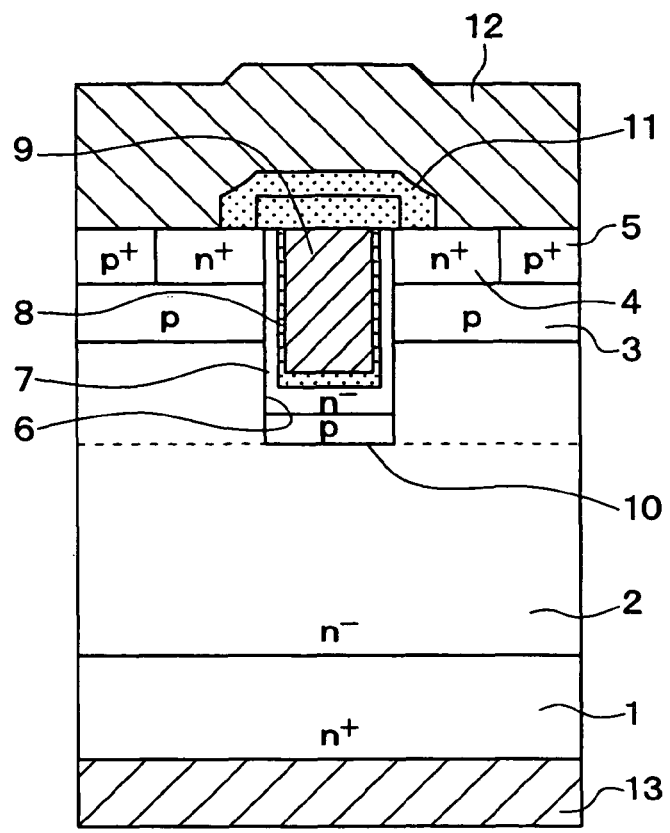
FIG. 2A is a diagram illustrating a cross-sectional view of the MOSFET taken along line IIA-IIA in FIG. 1.
Figure 2B:
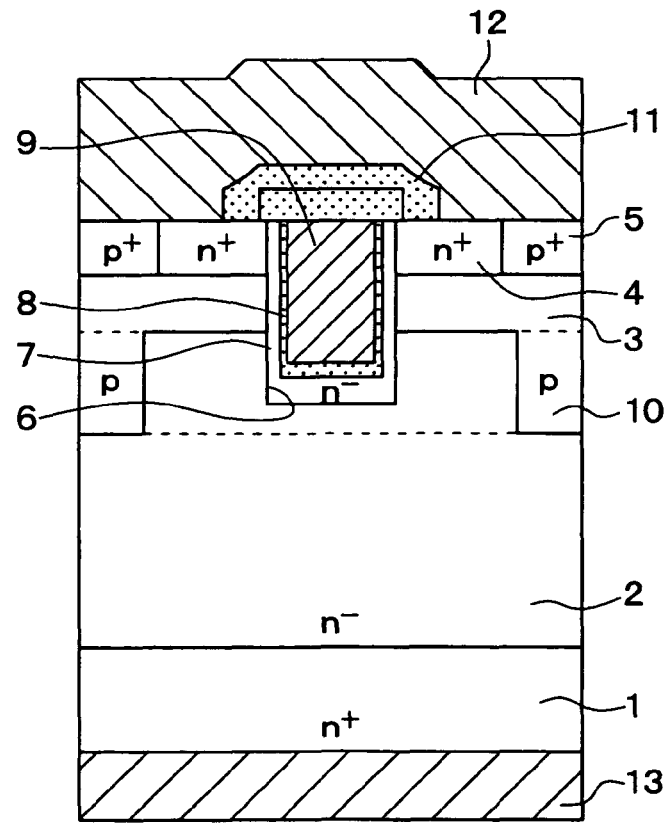
FIG. 2B is a diagram illustrating a cross-sectional view of the MOSFET taken along line IIB-IIB in FIG. 1.
Figure 2C:
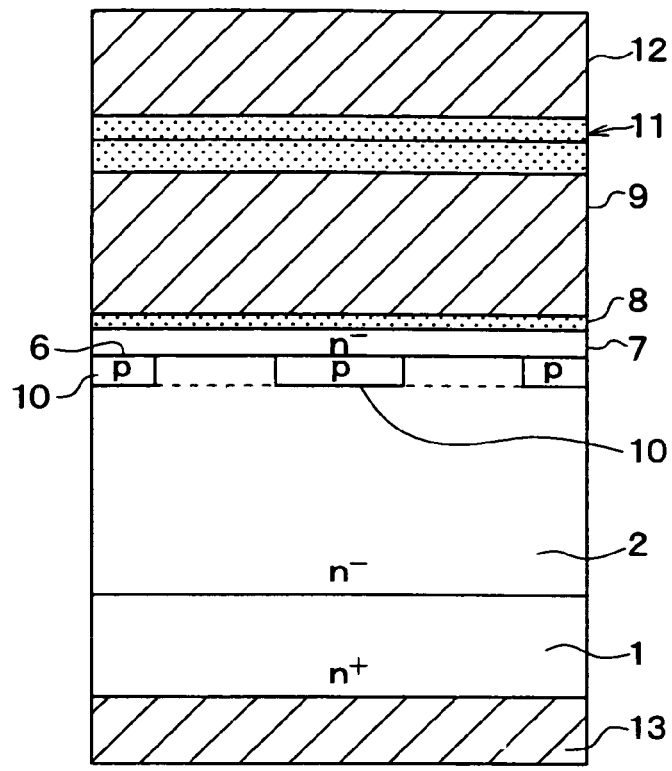
FIG. 2C is a diagram illustrating a cross-sectional view of the MOSFET taken along line IIC-IIC in FIG. 1.
Figure 2D:
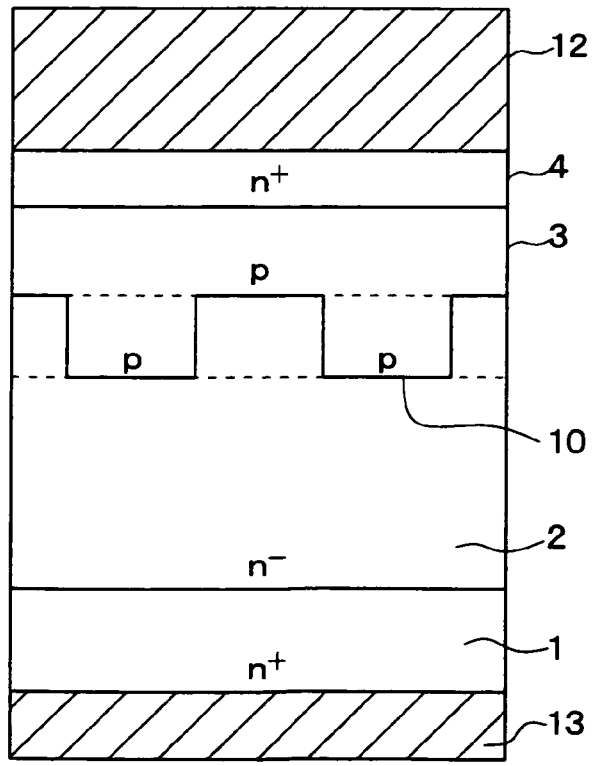
FIG. 2D is a diagram illustrating a cross-sectional view of the MOSFET taken along line IID-IID in FIG. 1.

One of the MOSFETs is illustrated in FIG. 1. In the SiC semiconductor device, the MOSFETs are arranged in a plurality of rows so as to be adjacent to each other.

The MOSFET includes an N+ type substrate 1 made of SiC. The N+ type substrate 1 includes, for example, phosphorus as N type impurities. An impurity concentration of the N+ type substrate 1 is, for example, about $1.0 \times 10^{19}$ cm$^{-3}$. The N+ type substrate 1 has a thickness of, for example, about 300 μm. On a front surface of the N+ type substrate 1, an N− type drift layer 2 made of SiC is located. The N− type drift layer 2 includes, for example, phosphorus as N type impurities. An impurity concentration of the N− type drift layer 2 is, for example, between about $3.0 \times 10^{15}$ cm$^{-3}$ and about $7.0 \times 10^{15}$ cm$^{-3}$. The N− type drift layer 2 has a thickness of, for example, between about 10 μm and about 15 μm. The impurity concentration of the N− type drift layer 2 may be substantially constant in a thickness direction of the N− type drift layer 2. Alternatively, the impurity concentration of the N− type drift layer 2 may be varied in the thickness direction of the N− type drift layer 2. For example, the impurity concentration of the N− type drift layer 2 may decrease toward a side away from the front surface of the N+ type substrate 1. The impurity concentration of a portion of the N− type drift layer 2 at a distance between about 3 μm and about 5 μm from the front surface of the N+ type substrate 1 may be greater than the impurity concentration of the other portion of the N− type drift layer 2 by about $2.0 \times 10^{15}$ cm$^{-3}$. In the present case, an internal resistance of the N− type drift layer 2 can be reduced. Thus, an on-resistance of the MOSFET can be reduced.

At a surface portion of the N− type drift layer 2, a P type base region 3 is located. At a surface portion of the P type base region 3, an N+ type source region 4 and a P+ type body layer 5 are located.

The P type base region 3 includes, for example, boron or aluminum, as P type impurities. An impurity concentration of the P type base region 3 is, for example, between about $5.0 \times 10^{16}$ cm$^{-3}$ and about $2.0 \times 10^{19}$ cm$^{-3}$. The P type base region 3 has a thickness of, for example, about 2.0 μm. The P type base region 3 sandwiches a trench 6. The N+ type source region 4 includes, for example, phosphorus as N type impurities. An impurity concentration of a surface portion of the N+ type source region 4 is, for example, about $1.0 \times 10^{21}$ cm$^{-3}$. The N+ type source region 4 has a thickness of, for example, about 0.3 μm. The P+ type body layer 5 includes, for example, boron or aluminum as P type impurities. An impurity concentration of a surface portion of the P+ type body layer 5 is, for example, about $1.0 \times 10^{21}$ cm$^{-3}$. The P+ type body layer 5 has a thickness of, for example, about 0.3 μm. The N+ type source region 4 sandwiches the trench 6. The P+ type body layer 5 sandwiches the N+ type source region 4 and the trench 6.

The trench 6 penetrates the N+ type source region 4 and the P type base region 3 to the N− type drift layer 2. The trench 6 has a width between about 1.4 μm and about 2.0 μm and has a depth greater than or equal to about 2.0 μm such as, for example, about 2.4 μm. A sidewall of the trench 6 is in contact with the P type base region 3 and the N+ type source region 4. On a surface of the sidewall of the trench 6, an N type channel layer 7 is located. The N type channel layer 7 includes, for example, phosphorus as N type impurities. An impurity concentration of the N type channel layer 7 is about $1.0 \times 10^{16}$ cm$^{-3}$, for example. The N type channel layer 7 provides a channel region. A thickness of the N type channel layer 7 is set so that the MOSFET becomes normally-off type. For example, the N type channel layer 7 has a thickness between about 0.3 μm and about 1.0 μm at a bottom portion the trench 6 and has a thickness between about 0.1 μm and about 0.3 μm on the sidewall of the trench 6.

A surface of the N type channel layer 7 is covered with a gate oxide layer 8. On a surface of the gate oxide layer 8, a gate electrode 9 made of doped polysilicon is located so as to fill the trench 6. The gate oxide layer 8 is formed by thermally oxidizing the surface of the N type channel layer 7. The gate oxide layer 8 has a thickness of about 100 nm at the bottom portion and the sidewall of the trench 6.

The trench 6, the N+ type source region 4, and the P+ type body layer 5 are formed along a y-direction illustrated in FIG. 1. The MOSFETs are arranged in an x-direction approximately perpendicular to the y-direction.

In the N− type drift layer 2, a P type deep layer 10 is located under the P type base region 3. The P type deep layer 10 includes a plurality of linear sections. Each section of the P type deep layer 10 is formed along a direction inclined to the sidewall of the trench 6 where the channel region is provided. That is, each section of the P type deep layer 10 is formed along a direction inclined to a longitudinal direction of the trench 6. The P type deep layer 10 extends to a depth deeper than the bottom portion the trench 6, that is, a bottom portion of the N type channel layer 7. For example, the P type deep layer 10 extends to a portion between about 2.6 μm and about 3.0 μm from the front surface of the N-type drift layer 2, that is, between about 0.6 μm and about 1.0 μm from a bottom portion of the P type base region 3. A width of each section of the P type deep layer 10 is, for example, between about 0.6 μm and about 1.0 μm. The P type deep layer 10 includes, for example, boron or aluminum as P type impurities. An impurity concentration of the P type deep layer 10 is, for example, between about $1.0 \times 10^{17}$ cm$^{-3}$ and about $1.0 \times 10^{19}$ cm$^{-3}$.

Figure 3:
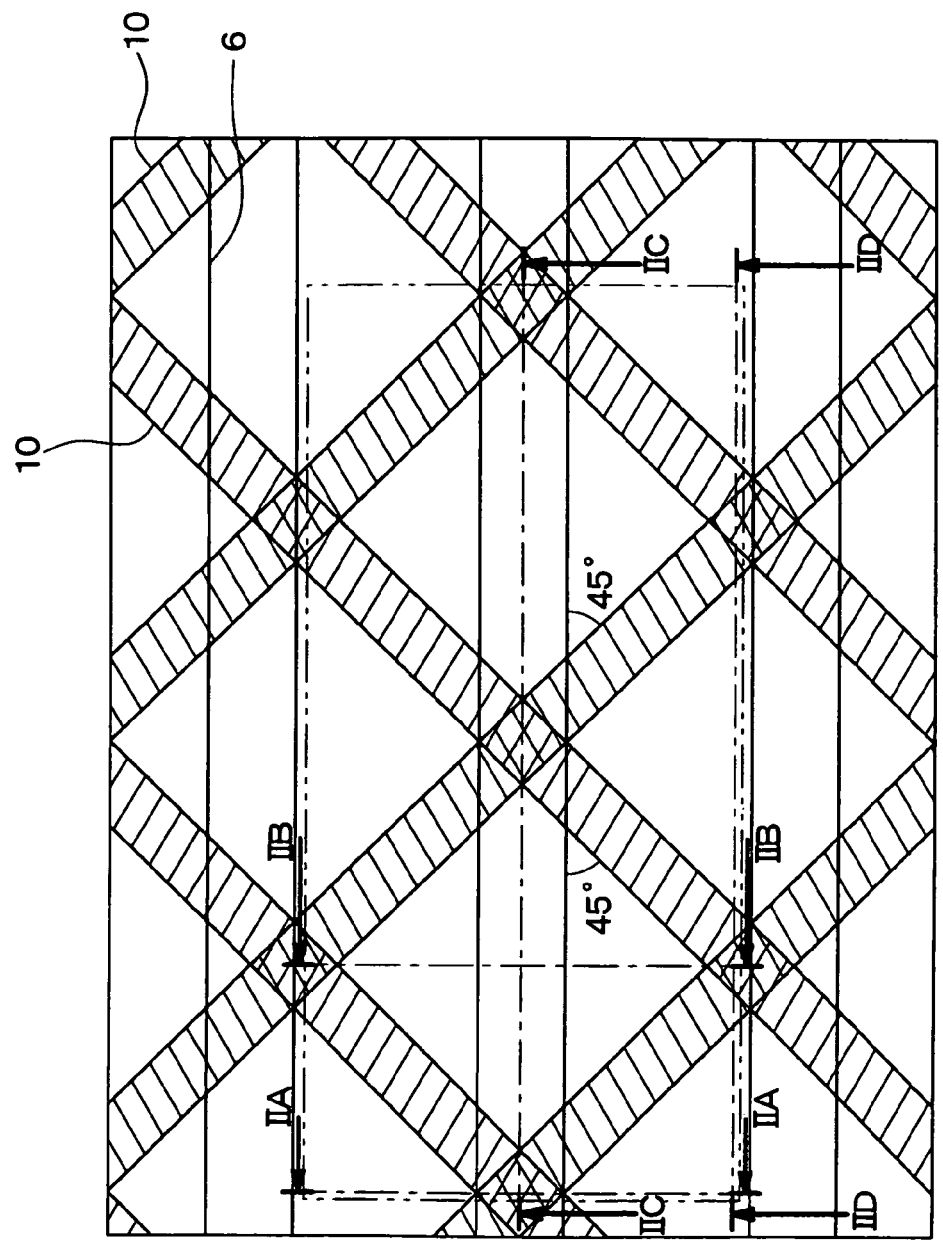
FIG. 3 is a diagram illustrating a layout of a deep layer and trenches in the MOSFET illustrated in FIG. 1.

As illustrated in FIG. 3, the P type deep layer 10 is formed into a lattice pattern. Some sections of the deep layer 10 are formed along a first direction and the other sections of the deep layer 10 are formed along a second direction. The first direction is inclined at about 45 degrees to the longitudinal direction of the trenches 6. The second direction is inclined at about 45 degrees to the longitudinal direction of the trenches 6 and is approximately perpendicular to the first direction. That is, the first direction and the second direction are inclined at approximately the same angle to the sidewall of the trenches 6 in opposite directions. The sections formed along the first direction are arranged at even intervals and the sections formed along the second direction are arranged at even intervals. The intervals are between about 2.0 μm and about 3.0 μm, for example. In this way, the P type deep layer 10 is formed into the lattice pattern and all the sections of the P type deep layer 10 are coupled with each other. Although the diagram illustrated in FIG. 3 is not a cross-sectional diagram, the P type deep layer 10 is hatched for facilitating an understanding of the diagram.

A source electrode 11 and a gate wiring (not shown) are located on surfaces of the N+ type source region 4, the P+ type body layer 5, and the gate electrode 9. The source electrode 11 and the gate wiring are made of a plurality of metals, for example, an alloy of nickel and aluminum. At least portions of the source electrode 11 and the gate wiring being in contact with an N type SiC are made of a metal that can provide an ohmic connection between each of the source electrode 11 and the gate wiring and the N type SiC. The N type SiC includes the N+ type source region 4 and the gate electrode 9 if the gate electrode 9 includes N type impurities. At least portions of the source electrode 11 and the gate wiring being in contact with a P type SiC are made of a metal that can provide an ohmic connection between each of the source electrode 11 and the gate wiring and the P type SiC. The P type SiC includes the P+ type body layer 5 and the gate electrode 9 if the gate electrode 9 includes P type impurities. The source electrode 11 and the gate wiring are located on an interlayer insulating layer 12. Thus, the source electrode 11 and the gate wiring are electrically insulated. The source electrode 11 is electrically coupled with the N+ type source region 4 and the P+ type body layer 5 through contact holes provided in the interlayer insulating layer 12. The gate wiring is electrically coupled with the gate electrode 9 though a contact hole provided in the interlayer insulating layer 12.

On a rear surface of the N+ type substrate 1, a drain electrode 13 is located. The drain electrode 13 is electrically coupled with the N+ type substrate 1. Thereby, the N channel accumulation-type MOSFET having a trench gate structure is formed.

The MOSFET may be operated, for example, as described below. When an impurity concentration of SiC is high, for example, about $1.0 \times 10^{19}$ cm$^{-3}$; the SiC has an internal voltage of about 3 V. Thus, before a gate voltage is applied to the gate electrode 9, the P type base region 3 acts as if the P type base region 3 has a voltage of about −3 V even when a voltage of the source electrode is 0 V. Thus, a depletion layer expands from the P type base region 3, and a region located adjacent to the P type base region 3 acts like an insulator. Accordingly, even if a positive voltage is applied to the drain electrode 13, the N type channel layer 7 acts like an insulator. Thus, electrons cannot reach the N type channel layer 7 and electric current does not flow between the source electrode 11 and the drain electrode 13.

When the MOSFET is deactivated, for example, when the gate voltage is 0 V, the drain voltage is about 650 V, and the source voltage is 0 V, even if a voltage is applied to the drain electrode 13, the voltage creates a reverse bias. Thus, the depletion layer expands from a region between the P type base region 3 and the N− type drift layer 2 and a region between the P type base region 3 and the N type channel layer 7. The impurity concentration of the P type base region 3 is much greater than the impurity concentration of the N− type drift layer 2. Thus, the depletion layer expands toward the N− type drift layer 2. For example, when the impurity concentration of the P type base region 3 is set to be about ten times greater than the impurity concentration of the N− type drift layer 2, the depletion layer expands about 0.7 μm toward the P type base region 3 and about 7.0 μm toward the N− type drift layer 2. The thickness of the P type base region 3 is about 2.0 μm and is greater than an expanding amount of the depletion layer. Thus, a punch through can be prevented. Because the depletion layer expands more than a case where the drain voltage is 0 V, the region that acts like an insulator expands. Thus, electric current does not flow between the source electrode 11 and the drain electrode 13.

Because the gate voltage is 0 V, an electric field is applied between the drain electrode 13 and the gate electrode 9. Thus, an electric field concentration can possibly occur at the bottom portion of the gate oxide layer 8. The SiC semiconductor device according to the present embodiment includes the P type deep layer 10 deeper than the trench 6. The depletion layer expands toward the N− type drift layer 2 at the PN junction between the P type deep layer 10 and the N-type drift layer 2. Thus, a high voltage due to the drain voltage is difficult to enter the gate oxide layer 8. When the impurity concentration of the P type deep layer 10 is set to be greater than the impurity concentration of the P type base region 3, an expanding amount of the depletion layer toward the N− type drift layer 2 increases. Thereby, an electric field concentration in the gate oxide layer 8, especially, the electric field concentration in the gate oxide layer 8 at the bottom portion of the trench 6 can be reduced. As a result, a damage of the gate oxide layer 8 can be reduced.

According to a simulation by the inventors, when a voltage of about 650 V is applied to the drain electrode 13, an electric field strength of the gate oxide layer 8 at the bottom portion of the trench 6 is about 2.0 MV/cm, which is a level that the gate oxide layer 8 is not broken. Thus, the gate oxide layer 8 is not broken even when the voltage of about 650 V is applied to the drain electrode 13.

As described above, the P type deep layer 10 is formed into the lattice pattern and all the sections of the P type deep layer 10 are coupled with each other. When a breakdown occurs at a bottom portion of the P type deep layer 10, electric current that flows at the breakdown disperses widely in the P type deep layer 10. Thus, even when the breakdown occurs, the electric current does not concentrate at a part of the P type deep layer 10 and an imbalance of the electric current can be restricted. Therefore, element can be restricted from being broken due to the electric current concentration.

When the MOSFET is activated, for example, when the gate voltage is about 20 V, the drain voltage is about 1 V, and the source voltage is 0 V, the gate electrode 9 is applied with the gate voltage of about 20 V. Thus, the N type channel layer 7 can function as an accumulation channel. Each sections of the P type deep layer 10 are arranged at the above-described intervals. Thus, when the MOSFET is activated, a punch through can be prevented by the depletion layer extending from the P type deep layer 10 toward the N− type drift layer 2. Thus, electrons induced from the source electrode 11 flow to the N− type drift layer 2 through the N+ type source region 4 and the N type channel layer 7. Thereby, electric current flows between the source electrode 11 and the drain electrode 13.

According to a calculation by the inventors, an on-resistance of the SiC semiconductor device according to the present embodiment is about 4.9 mΩ·cm$^2$ and an on-resistance of an SiC semiconductor device without the P type deep layer 10 is about 4.3 mΩ·cm$^2$. Thus, the on-resistance increases by about 15% by providing the P type deep layer 10. The on-resistance increases because a channel is not formed on the sidewall of the trench 6 at portions where the P type deep layer 10 is formed. However, the increase of the on-resistance is not so large and can be controlled by changing the width of each section of the P type deep layer 10 and the intervals of each section of the P type deep layer 10. Thus, the increase of the on-resistance does not become an issue.

An exemplary method of manufacturing the MOSFET illustrated in FIG. 1 will now be described with reference to FIG. 4A to FIG. 5F. During a process illustrated in FIG. 4A and FIG. 4B, the N+ type substrate 1 made of SiC is prepared. The concentration of the N type impurity in the N+ type substrate 1 is about $1.0 \times 10^{19}$ cm$^{-3}$, for example. The thickness of the N+ type substrate 1 is about 300 μm, for example. On the rear surface of the N+ type substrate 1, the drain electrode 13 is formed. On the front surface of the N+ type substrate 1, the N− type drift layer 2 is epitaxially formed. The concentration of the N type impurity in the N− type drift layer 2 is between about $3.0 \times 10^{15}$ cm$^{-3}$ and about $7.0 \times 10^{15}$ cm$^{-3}$, for example. The thickness of the N− type drift layer 2 is about 15 μm.

Figure 4A:
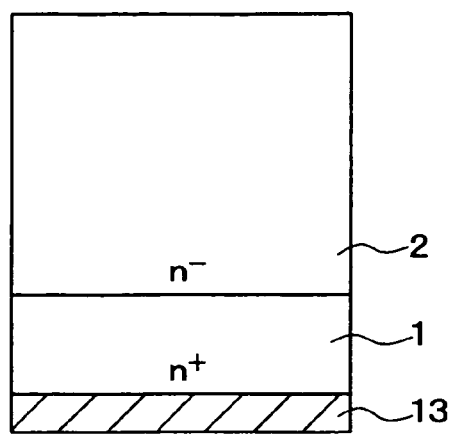
FIG. 4A, FIG. 4C, FIG. 4E, FIG. 5A, FIG. 5C, and FIG. 5E are diagrams illustrating cross-sectional views of an exemplary manufacturing process of the MOSFET taken along line IIA-IIA in FIG. 1.
Figure 4B:
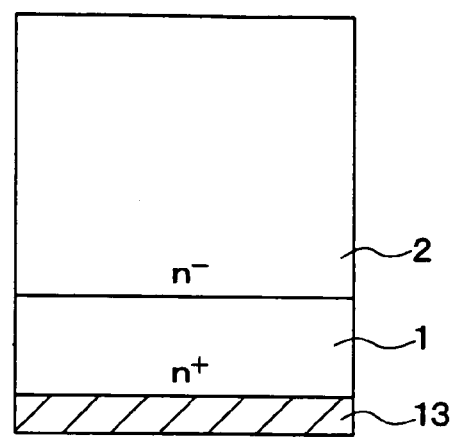
FIG. 4B, FIG. 4D, FIG. 4F, FIG. 5B, FIG. 5D, and FIG. 5F are diagrams illustrating cross-sectional views of the exemplary manufacturing process of the MOSFET taken along line 11D-11D in FIG. 1.
Figure 4C:
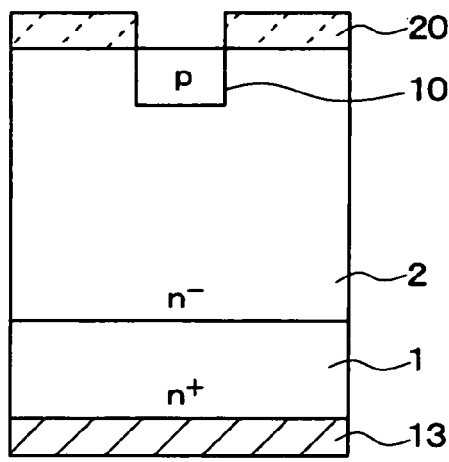
Figure 4D:
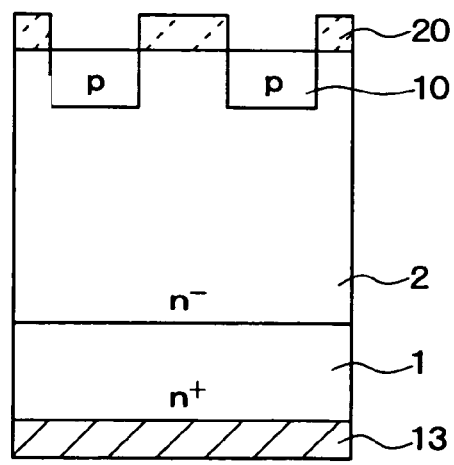

During a process illustrated in FIGS. 4C and 4D, a mask 20 is formed on the front surface of the N− type drift layer 2. The mask 20 is made of low temperature oxide (LTO), for example. Then, an opening portion is provided in the mask 20 by a photolithography process. The opening portion is provided at a region where the P type deep layer 10 will be formed. Thereby, the mask 20 has the opening portion having the lattice pattern. The P type impurities are ion-implanted through the mask 20 and are activated. Thereby, the P type deep layer 10 is formed. The P type impurities are boron or aluminum, for example. The impurity concentration in the P type deep layer 10 is between about $1.0 \times 10^{17}$ cm$^{-3}$ and about $1.0 \times 10^{19}$ cm$^{-3}$, for example. The thickness of the P type deep layer 10 is between about 0.6 μm and about 1.0 μm, for example. The width of each section of the P type deep layer 10 is between about 0.6 μm and about 1.0 μm. After forming the P type deep layer 10, the mask 20 is removed.

Figure 4E:
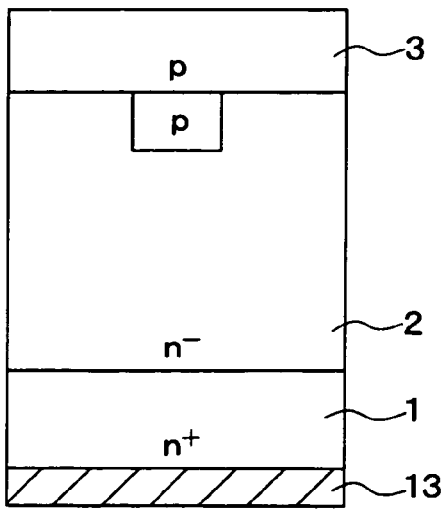
Figure 4F:
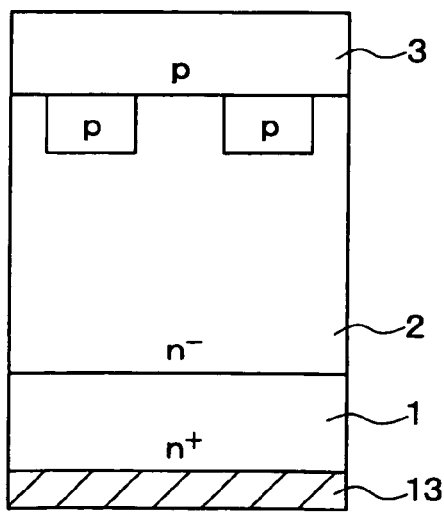

During a process illustrated in FIG. 4E and FIG. 4F, the P type base region 3 is formed on the N− type drift layer 2. The impurity concentration in the P type base region 3 is between about $5.0 \times 10^{16}$ cm$^3$ and about $2.0 \times 10^{19}$ cm$^{-3}$, for example. The thickness of the P type base region 3 is about 2.0 μm, for example.

Figure 5A:
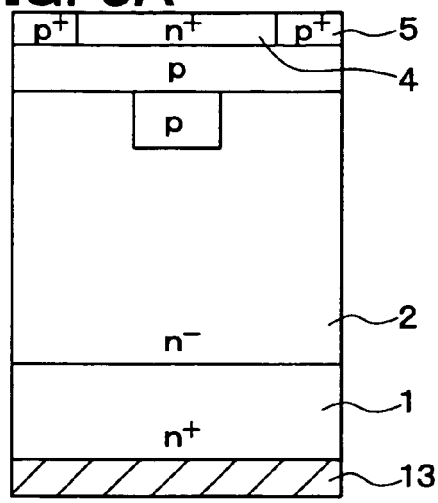
Figure 5B:
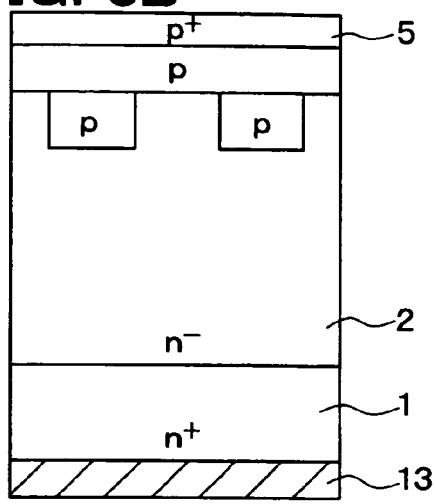

During a process illustrated in FIGS. 5A and 5B, a first mask (not shown), for example, made of LTO is formed. Then, an opening portion is provided in the first mask by a photolithography process. The opening portion is provided at a portion where the N+ type source region 4 will be formed. Then, the N type impurities are ion-implanted. The N type impurities include nitrogen, for example. After removing the first mask, a second mask, for example, made of LTO is formed. An opening portion is provided in the second mask by a photolithography process. The opening portion is provided at a portion where the P+ type body layer 5 will be formed. Then, the P type impurities are ion-implanted. The P type impurities include nitrogen, for example. The implanted ions are activated. Thereby, the N+ type source region 4 and the P+ type body layer 5 are formed. The impurity concentration at the surface portion of the N+ type source region 4 is about $1.0 \times 10^{21}$ cm$^{-3}$ and the thickness of the N+ type source region 4 is about 0.3 µm, for example. The impurity concentration at the surface portion of the P+ type body layer 5 is about $1.0 \times 10^{21}$ cm$^{-3}$ and the thickness of the P type body layer 5 is about 0.3 µm, for example. After forming the P+ type body layer 5, the second mask is removed.

Figure 5C:
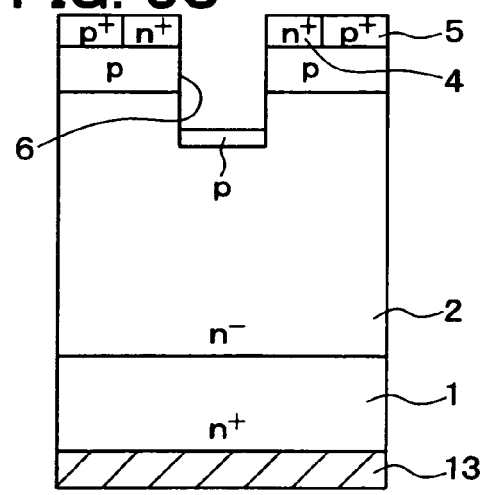
Figure 5D:
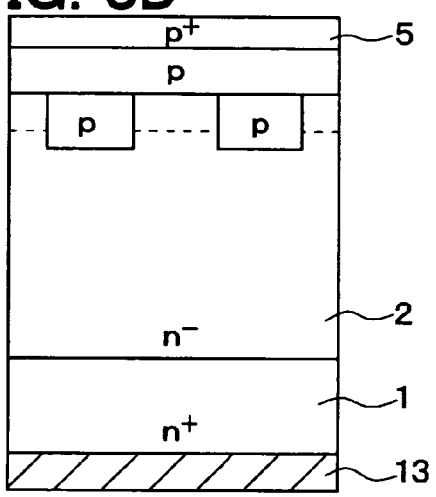

During a process illustrated in FIG. 5C and FIG. 5D, an etching mask (not shown) is formed on the N+ type source region 4 and the P+ type body layer 5. An opening portion is provided in the etching mask so that a region where the trench 6 will be provided is open. Then, an anisotropic etching process is performed using the etching mask. After that, an isotropic etching process and/or a sacrificial oxidation are performed if needed. Thereby, the trench 6 is provided. Then, the etching mask is removed.

Figure 5E:
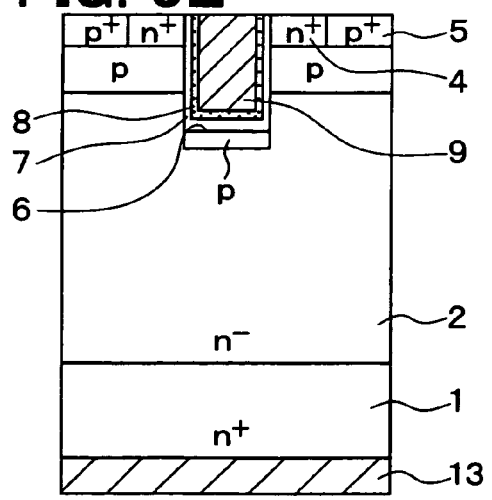
Figure 5F:
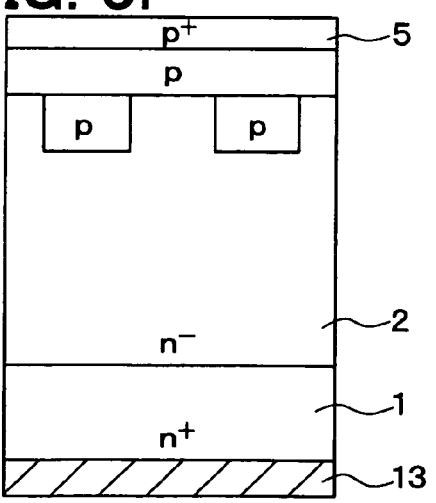

During a process illustrated in FIG. 5E and FIG. 5F, the N type channel layer 7 is epitaxially formed on the whole area of the surface of the substrate. The concentration of the N type impurities in the N type channel layer 7 is about $1.0 \times 10^{16}$ cm$^{-3}$, for example. Due to a plane direction dependence of the epitaxial growth, the N type channel layer 7 at the bottom portion of the trench 6 becomes thicker than the N type channel layer 7 on the sidewall of the trench 6. Then, unnecessary portion of the N type channel layer 7, that is, portion of the N type channel layer 7 formed on the P type base region 3, the N+ type source region 4, and the P+ type body layer 5 are removed. The gate oxide layer 8 is formed by thermal oxidation in a wet atmosphere, for example.

A polysilicon layer doped with the N type impurities is formed on the surface of the gate oxide layer 8, for example, at 600 degrees centigrade so as to have a thickness of about 440 nm. Then, an etch back process is performed so that the gate oxide layer 8 and the gate electrode 9 remain in the trench 6.

A process after forming the gate oxide layer 8 and the gate electrode 9 are similar to a known process. Therefore, the process after forming the gate oxide layer 8 and the gate electrode 9 is not illustrated. The interlayer insulating layer 12 is formed and the contact holes extending to corresponding ones of the N+ type source region 4 and the P+ type body layer 5 are provided in a cross section of the interlayer insulating layer 12. In addition, the contact hole extending to the gate electrode 9 is provided in another cross section of the interlayer insulating layer 12. A layer of an electrode material is formed on the interlayer insulating layer 12 so as to fill the contact holes and is pattern-formed. Thereby, the source electrode 11 and the gate wiring are formed and the MOSFET illustrated in FIG. 1 is formed.

In the present manufacturing method, the P type deep layer 10 is not formed by providing a trench and epitaxially forming P type layers so as to fill the trenches. Thus, a planarization process after forming the P type layer is not required. As a result, a crystal defect, which can possibly generate due to the planarization process, can be prevented.

In the present manufacturing method, the P type deep layer 10 is formed by the ion implantation from the surface of the N− type drift layer 2. Alternatively, the ion implantation may be performed from the surface of the P type base region 3. When the ion implantation is performed from the surface of the N− type drift layer 2, the ion implantation does not require a high energy compared with a case where the ion implantation is performed from the surface of the P type base region 3. Thus, a crystal defect, which can possibly be generated due to an ion implantation with a high energy, can be prevented.

In a case where the longitudinal direction of the trench 6 and the longitudinal direction of each section of the P type deep layer 10 are parallel to each other, a device property is affected by a variation in a distance between the trench 6 and the P type deep layer 10. Thus, a mask for providing the trench 6 and a mask for providing the P type deep layer 10 are required to be positioned with a high degree of accuracy. However, it is inevitable that the masks can possibly be out of alignment. Thus, an effect of a misalignment of the masks on the device property cannot be completely prevented. In the SiC semiconductor device according to the present embodiment, the longitudinal direction of each section of the P type deep layer 10 is inclined to the longitudinal direction of the trenches 6, and the P type deep layer 10 crosses the trenches 6. In addition, the P type deep layer 10 is formed into the lattice pattern. Thus, the device property is not affected by the misalignment of the masks. Thereby, a variation in a production property can be reduced and a yield can be improved.

Second Embodiment

An SiC semiconductor device according to a second embodiment of the present invention will be described with reference to FIG. 6 to FIG. 7D.

Figure 6:
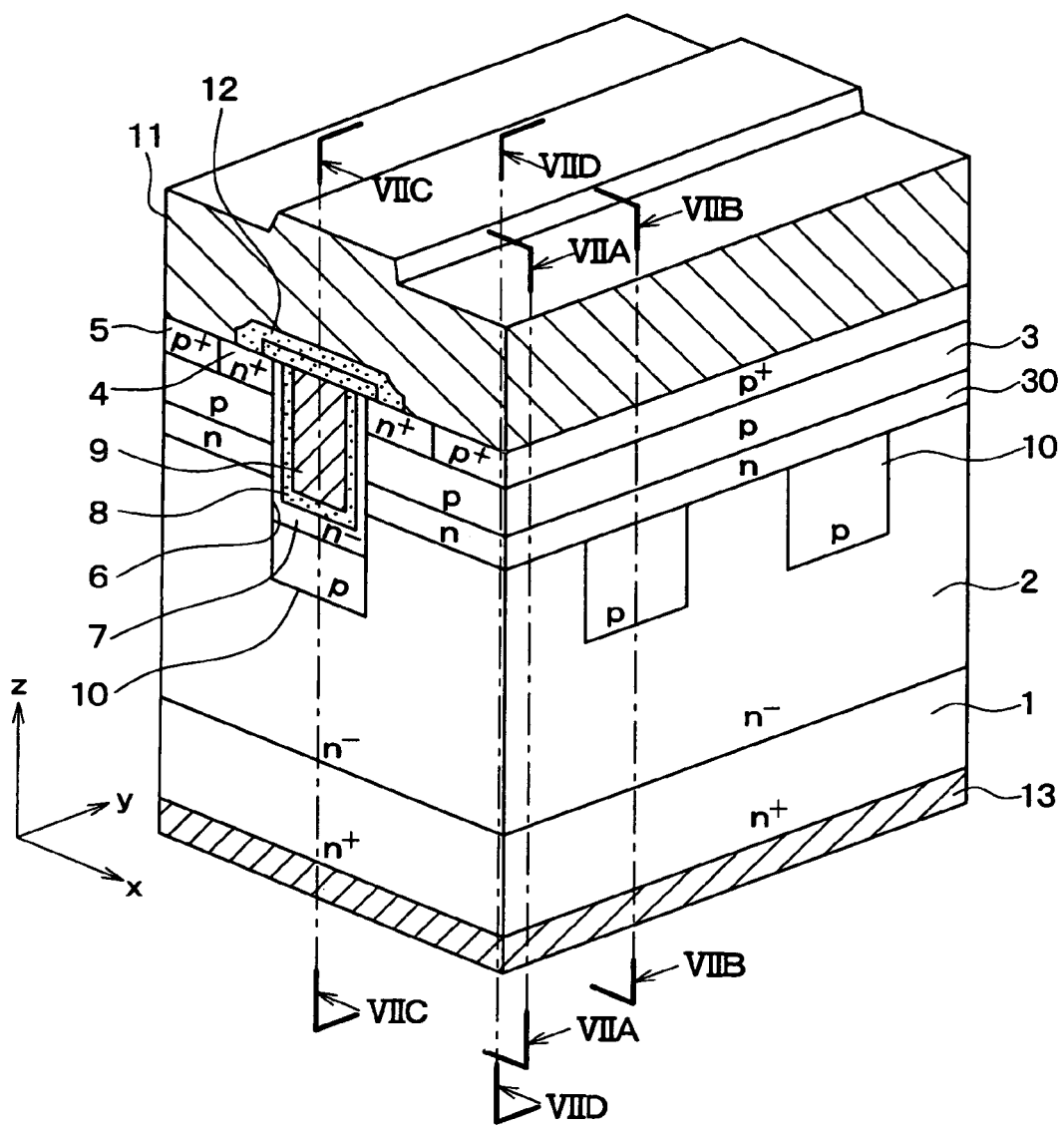
FIG. 6 is a diagram illustrating perspective cross-sectional view of a MOSFET in an SiC semiconductor device according to a second embodiment.
Figure 7A:
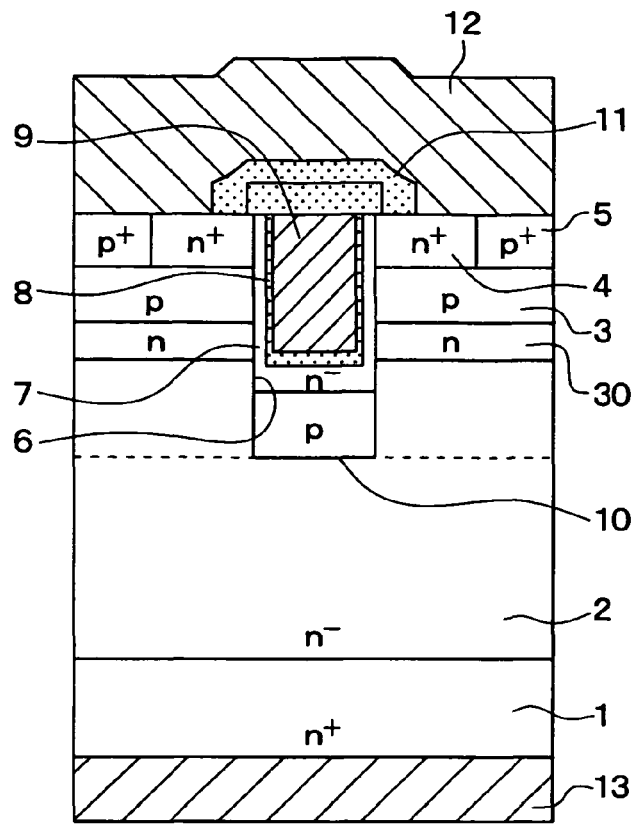
FIG. 7A is a diagram illustrating a cross-sectional view of the MOSFET taken along line VIIA-VIIA in FIG. 6.
Figure 7B:
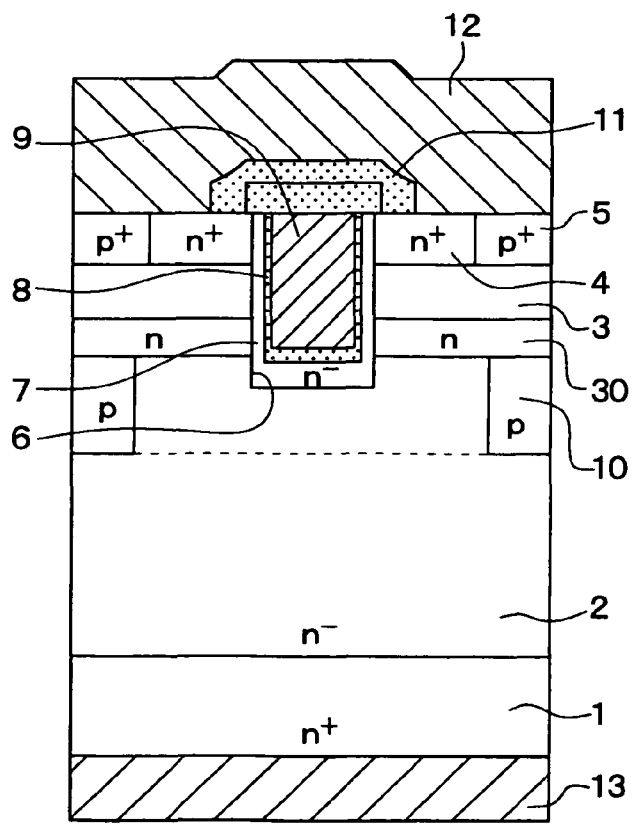
FIG. 7B is a diagram illustrating a cross-sectional view of the MOSFET taken along line VIIB-VIIB in FIG. 6.
Figure 7C:
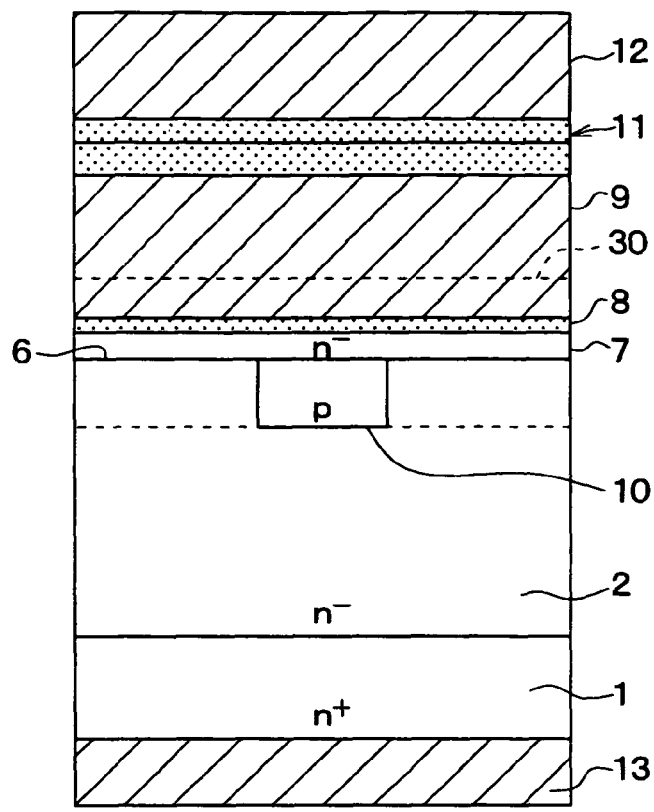
FIG. 7C is a diagram illustrating a cross-sectional view of the MOSFET taken along line VIIC-VIIC in FIG. 6.
Figure 7D:
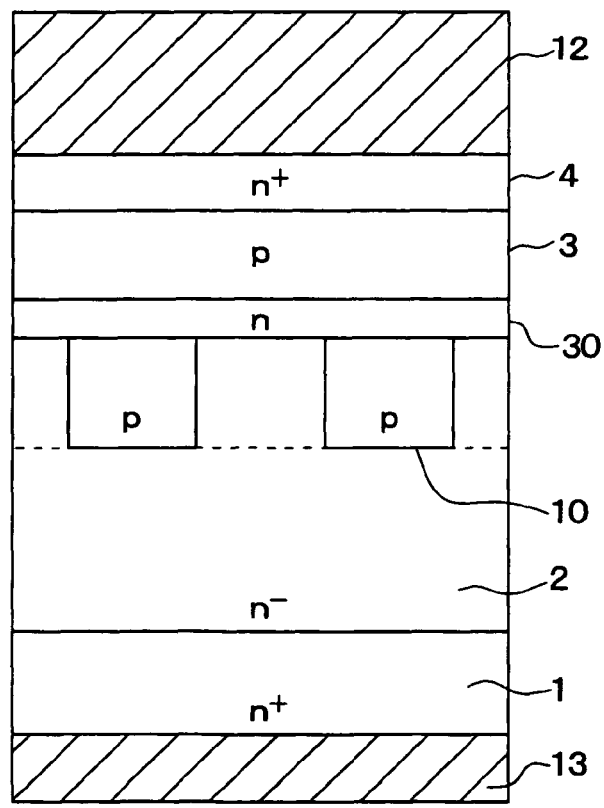
FIG. 7D is a diagram illustrating a cross-sectional view of the MOSFET taken along line VIID-VIID in FIG. 6.
Figure 8A:
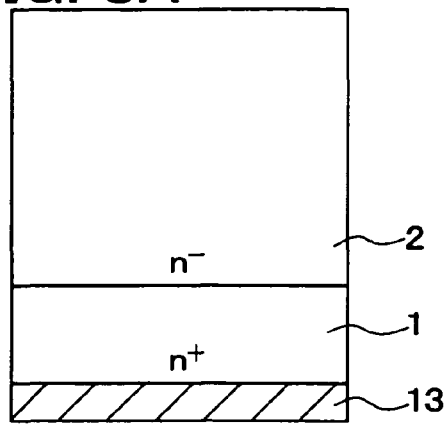
FIG. 8A, FIG. 8C, FIG. 8E, FIG. 9A, FIG. 9C, and FIG. 9E are diagrams illustrating cross-sectional views of an exemplary manufacturing process of the MOSFET taken along line VIIA-VIIA in FIG. 6.
Figure 8B:
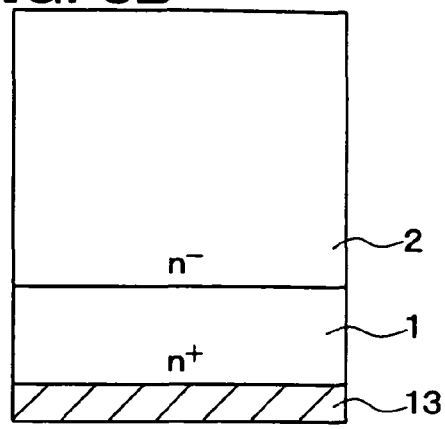
FIG. 8B, FIG. 8D, FIG. 8F, FIG. 9B, FIG. 9D, and FIG. 9F are diagrams illustrating cross-sectional views of the exemplary manufacturing process of the MOSFET taken along line VIID-VIID in FIG. 6.
Figure 8C:
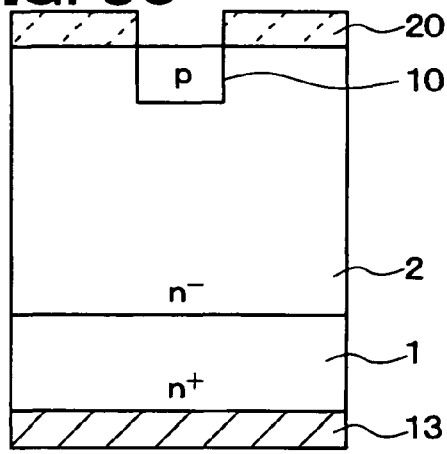
Figure 8D:
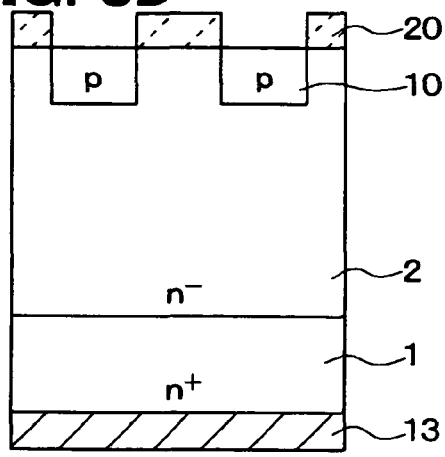
Figure 8E:
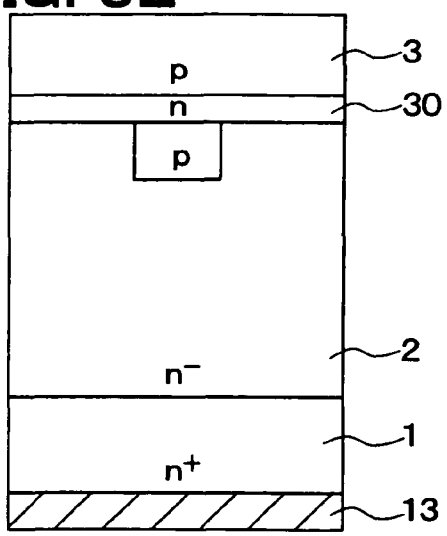
Figure 8F:
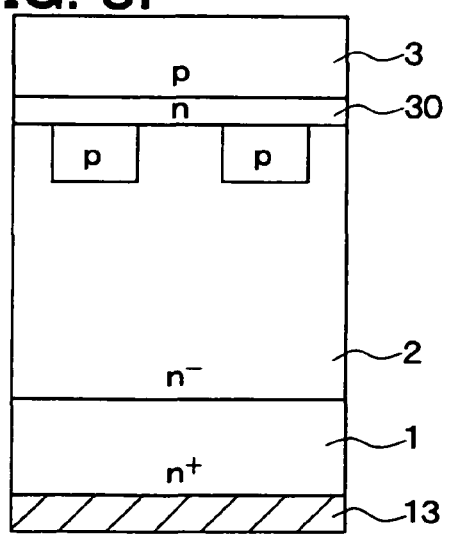
Figure 9A:
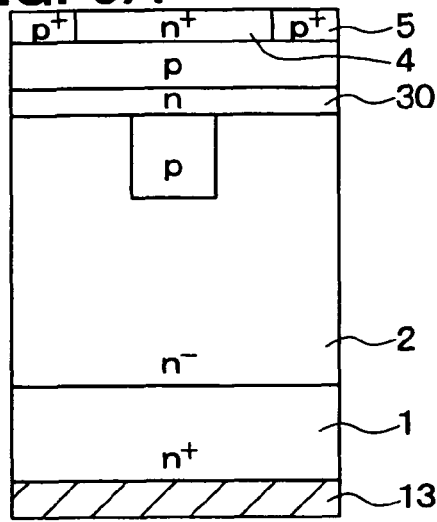
Figure 9B:
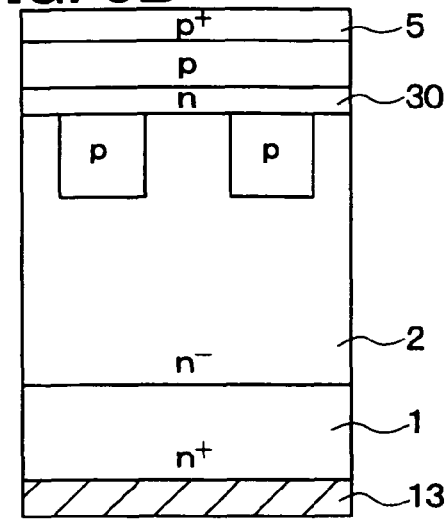
Figure 9C:
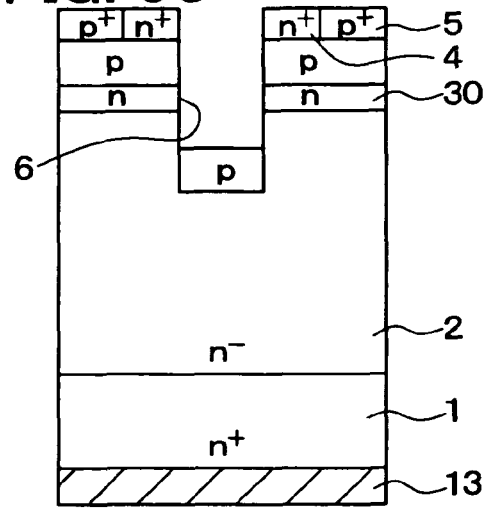
Figure 9D:
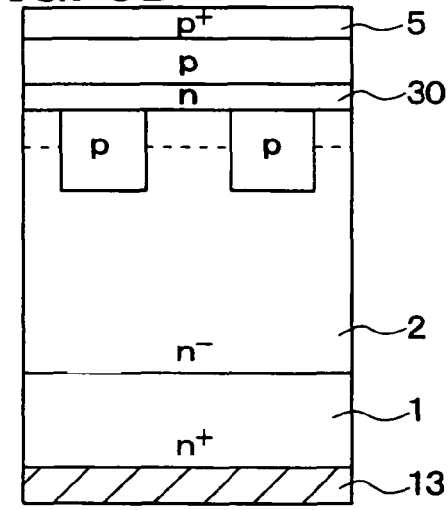
Figure 9E:
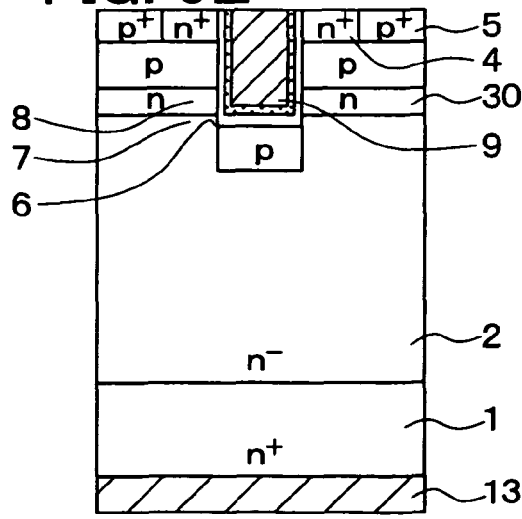
Figure 9F:
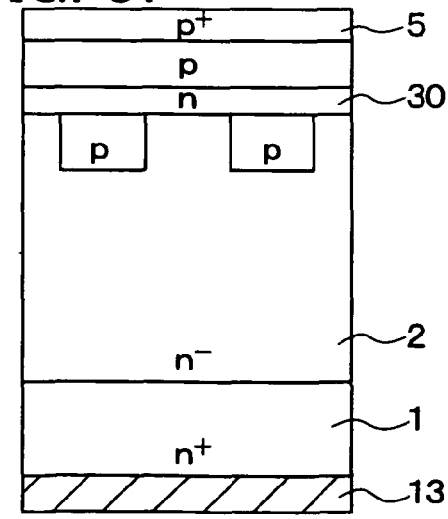

As illustrated in FIG. 6, in a MOSFET included in the SiC semiconductor device according to the present embodiment, an N type current diffusion layer 30 is disposed between the N− type drift layer 2 and the P type base region 3 so as to be in contact with the N type channel layer 7. The N type current diffusion layer 30 includes, for example, phosphorous as N type impurities. A concentration of the N type impurities in the N type current diffusion layer 30 is set to be greater than the concentration of the N type impurity in the N− type drift layer 2. The concentration of the N type impurity in the N type current diffusion layer 30 may be greater than the concentration of the N type impurity in the N type channel layer 7. For example, the impurity concentration in the N type current diffusion layer 30 is between about $2.0 \times 10^{15}$ cm$^{-3}$ and about $1.0 \times 10^{17}$ cm$^{-3}$. The N type current diffusion layer 30 may have any thickness. For example, the N type current diffusion layer 30 has a thickness of about 0.3 µm so that the trench 6 can penetrate through the N type current diffusion layer 30. The P type deep layer 10 is formed under the N type current diffusion layer 30. The N type current diffusion layer 30 separates the P type deep layer 10 and the P type base region 3. For example, the P type deep layer 10 has a depth between about 0.6 µm and about 1.0 µm from a rear surface of the N type current diffusion layer 30. An impurity concentration, a width, and an interval of each section of the P type deep layer 10 according to the present embodiment are similar to those of the P type deep layer 10 illustrated in FIG. 1.

The present MOSFET can be operated in a manner similar to the MOSFET illustrated in FIG. 1. When the present MOSFET is activated, electric current that flows in the N type channel layer 7 is extended in the N type current diffusion layer 30 in an approximately normal direction to the sidewall of the trench 6. Thus, the electric current disperses widely in the N− type drift layer 2. As a result, an on-resistance of the present MOSFET can be reduced compared with the MOSFET illustrated in FIG. 1.

An exemplary method of manufacturing the MOSFET illustrated in FIG. 6 will be described with reference to FIG. 8A to FIG. 9F.

During a process illustrated in FIG. 8A to FIG. 8D, the drain electrode 13 is formed on the rear surface of the N+ type substrate 1, the N− type drift layer 2 is formed on the front surface of the N+ type substrate 1, and the P type deep layer 10 is formed in the N− type drift layer 2 in a manner similar to the process illustrated in FIG. 4A to FIG. 4D. During a process illustrated in FIG. 8E and FIG. 8F, the N type current diffusion layer 30 is epitaxially formed on the front surface of the N− type drift layer 2 and the front surface of the P type deep layer 10. In addition, the P type base region 3 is epitaxially formed on the front surface of the N type current diffusion layer 30. During a process illustrated in FIG. 9A-9F, the N+ type source region 4, the P+ type body layer 5, the trench 6, the N type channel layer 7, the gate oxide layer 8, and the gate electrode 9 are formed in a manner similar to the process illustrated FIG. 5A to FIG. 5F. Furthermore, the interlayer insulating layer 12, the contact holes, the source electrode 11, and the gate wiring are formed. Thereby, the MOSFET illustrated in FIG. 6 is formed.

Third Embodiment

An SiC semiconductor device according to a third embodiment of the present invention will be described with reference to FIG. 10 to FIG. 11D.

Figure 10:
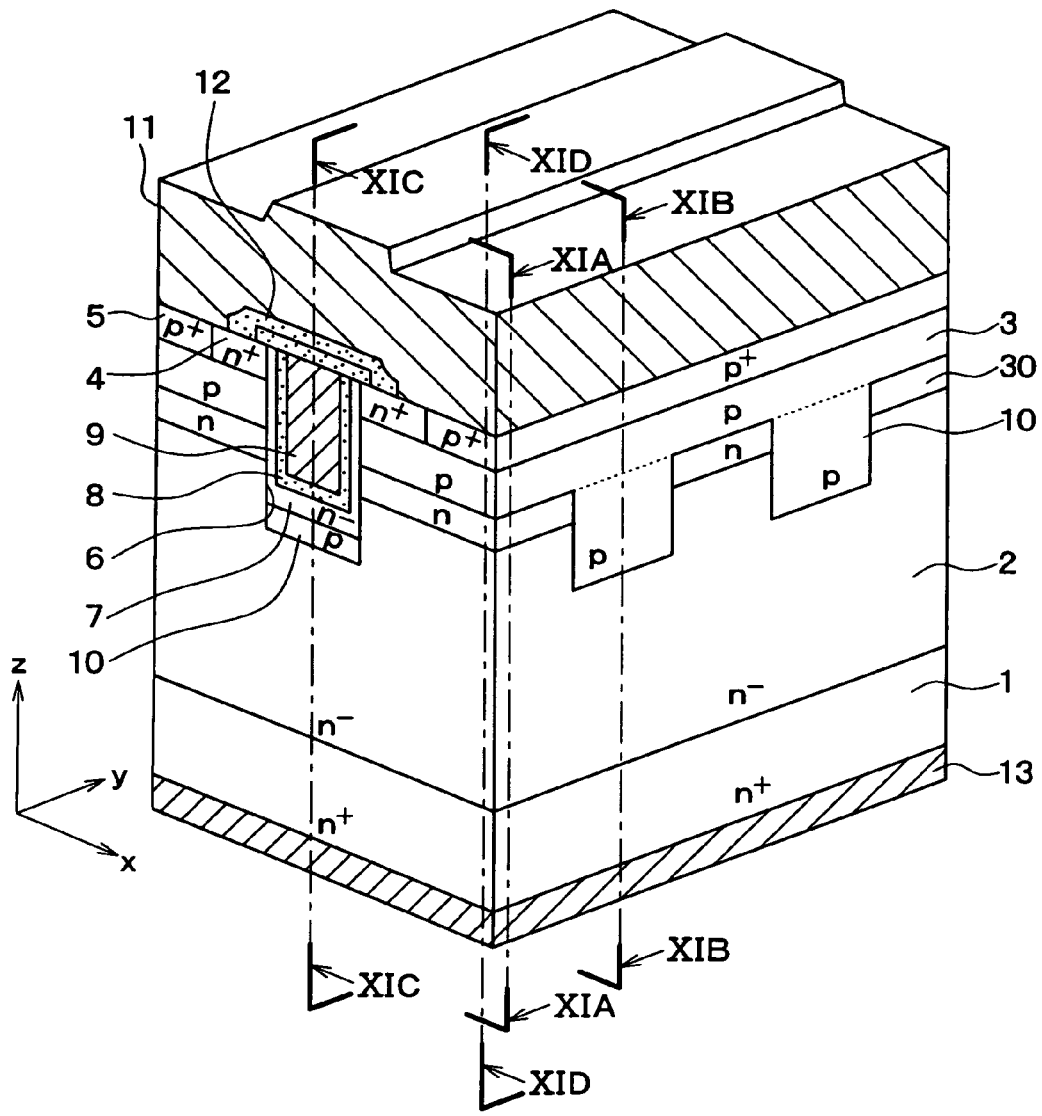
FIG. 10 is a diagram illustrating a perspective cross-sectional view of a MOSFET in an SiC semiconductor device according to a third embodiment.
Figure 11A:
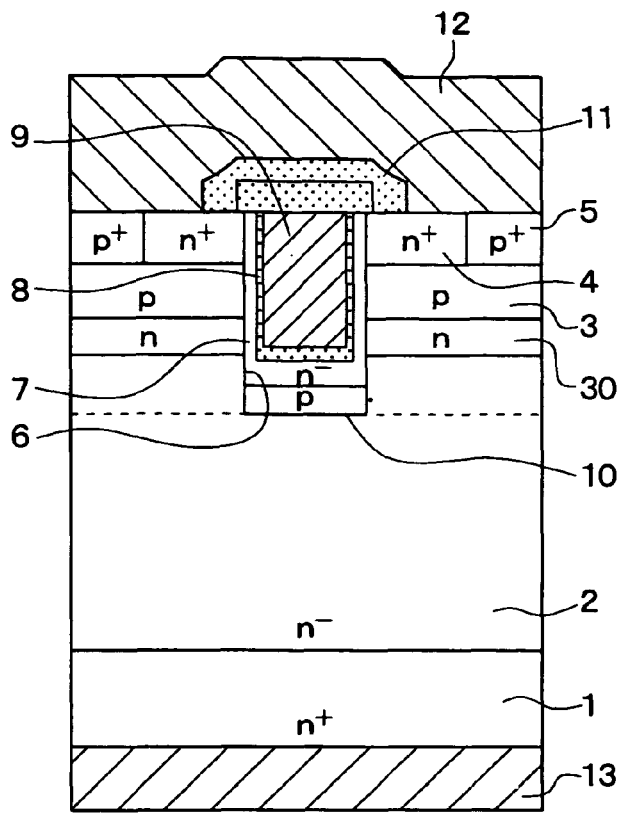
FIG. 11A is a diagram illustrating a cross-sectional view of the MOSFET taken along line XIA-XIA in FIG. 10.
Figure 11B:
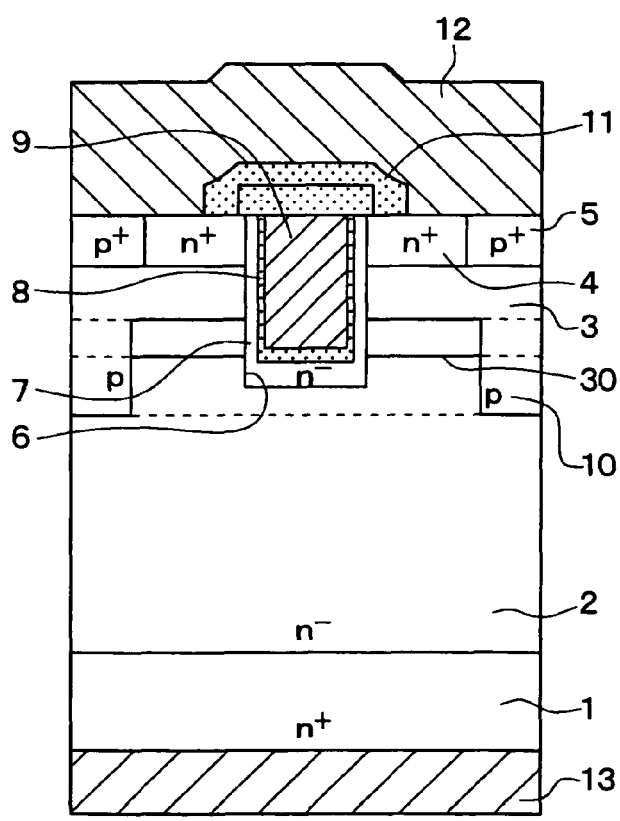
FIG. 11B is a diagram illustrating a cross-sectional view of the MOSFET taken along line XIB-XIB in FIG. 10.
Figure 11C:
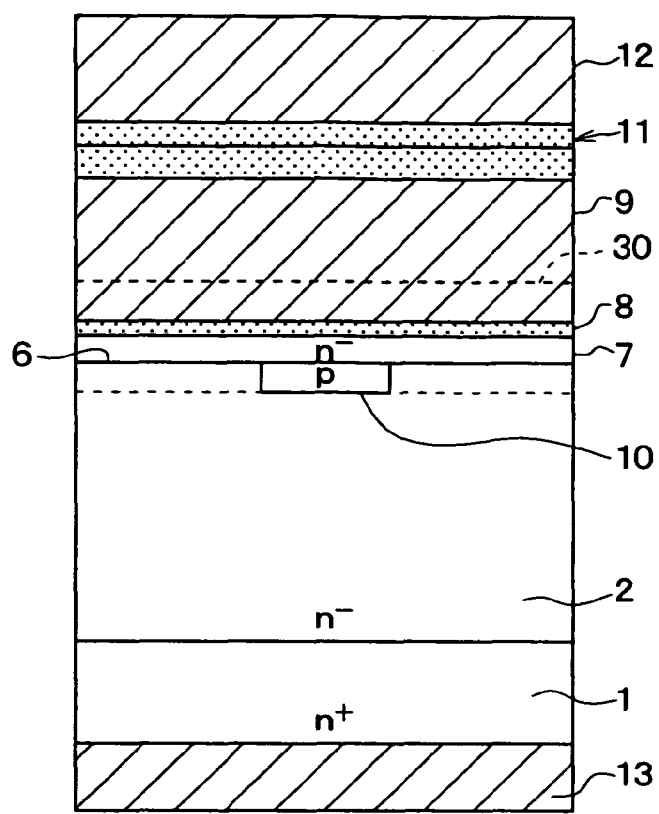
FIG. 11C is a diagram illustrating a cross-sectional view of the MOSFET taken along line XIC-XIC in FIG. 10.
Figure 11D:
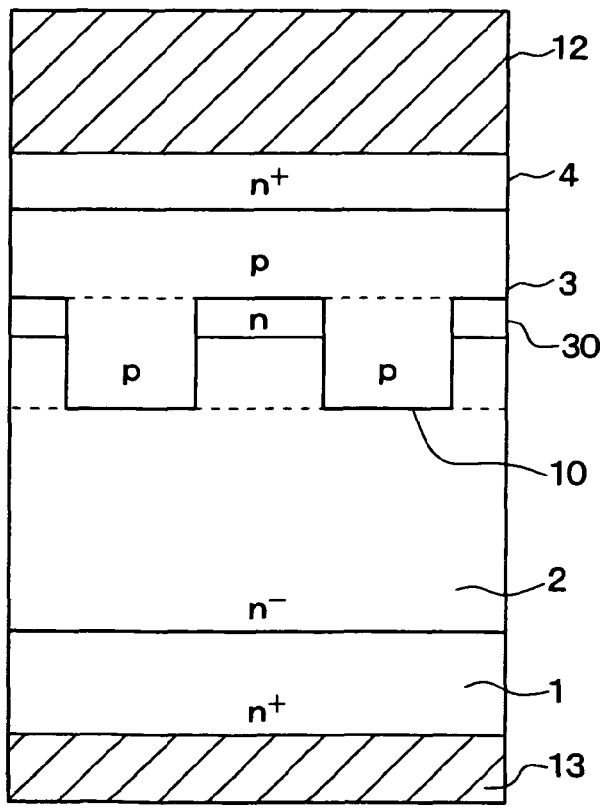
FIG. 11D is a diagram illustrating a cross-sectional view of the MOSFET taken along line XID-XID in FIG. 10.

As illustrated in FIG. 10, in a MOSFET included in the SiC semiconductor device according to the present embodiment, the N type current diffusion layer 30 is disposed between the N− type drift layer 2 and the P type base region 3 so as to be in contact with the N type channel layer 7. The P type deep layer 10 extends from the front surface of the N type current diffusion layer 30. The P type deep layer 10 penetrates through the N type current diffusion layer 30 and is contact with the P type base region 3. For example, the P type deep layer 10 has a depth between about 0.6 μm and about 1.0 μm from the front surface of the N type current diffusion layer 30. An impurity concentration, a width, and an interval of each section of the P type deep layer 10 according to the present embodiment are similar to those of the P type deep layer 10 illustrated in FIG. 1.

The MOSFET according to the present embodiment can be operated in a manner similar to the MOSFET illustrated in FIG. 1. When the MOSFET is activated, electric current that flows in the N type channel layer 7 is extended in the N type current diffusion layer 30 in an approximately normal direction to the sidewall of the trench 6. Thus, the electric current disperse widely in the N− type drift layer 2 and the on-resistance can be reduced in a manner similar to the MOSFET illustrated in FIG. 6. In addition, because the P type deep layer 10 is in contact with the P type base region 3, an electric potential of the P type deep layer 10 can be fixed to a source potential. Thus, an electric field relaxing effect of the MOSFET according to the present embodiment is greater than an electric field relaxing effect of the MOSFET illustrated in FIG. 6, in which the P type deep layer 10 is separated from the P type base region 3 by the N type current diffusion layer 30 and the P type deep layer 10 is in a floating state.

An exemplary manufacturing method of the MOSFET illustrated in FIG. 11 will be described with reference to FIG. 12A to FIG. 13F.

Figure 12A:
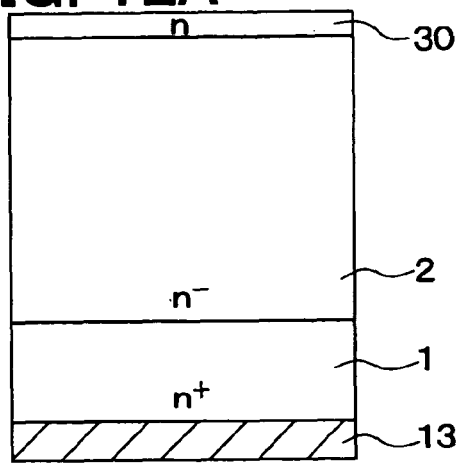
FIG. 12A, FIG. 12C, FIG. 12E, FIG. 13A, FIG. 13C, and FIG. 13E are diagrams illustrating cross-sectional views of an exemplary manufacturing process of the MOSFET taken along line XIA-XIA in FIG. 10.
Figure 12B:
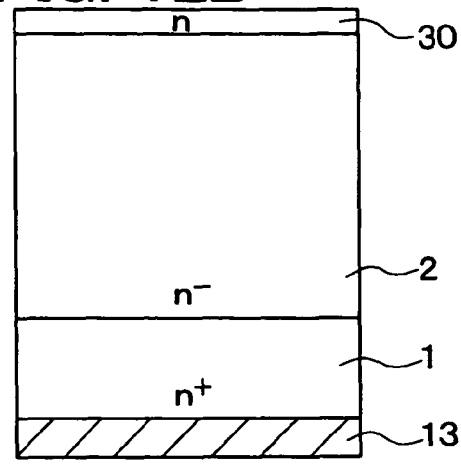
FIG. 12B, FIG. 12D, FIG. 12F, FIG. 13B, FIG. 13D, and FIG. 13F are diagrams illustrating cross-sectional views of the exemplary manufacturing process of the MOSFET taken along line XID-XID in FIG. 10.
Figure 12C:
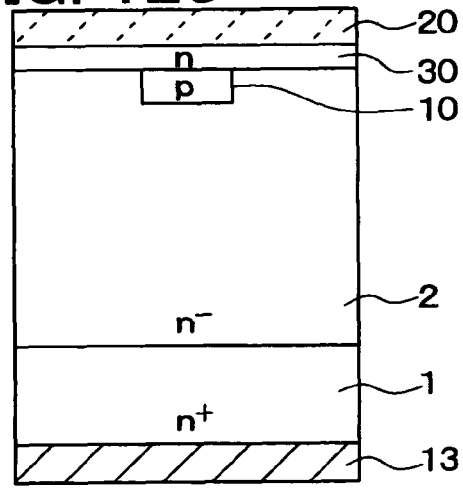
Figure 12D:
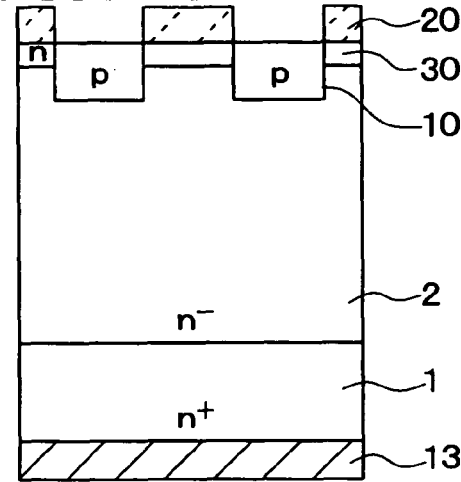
Figure 12E:
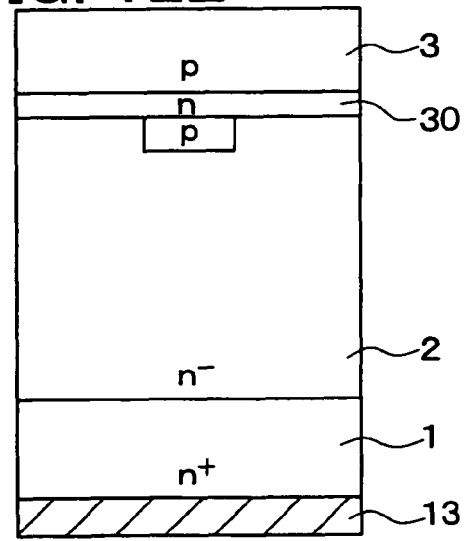
Figure 12F:
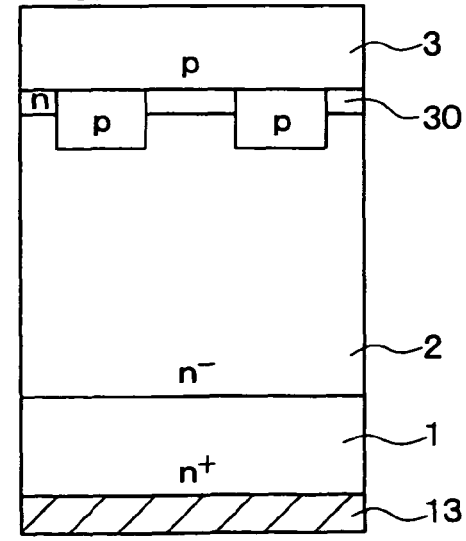
Figure 13A:
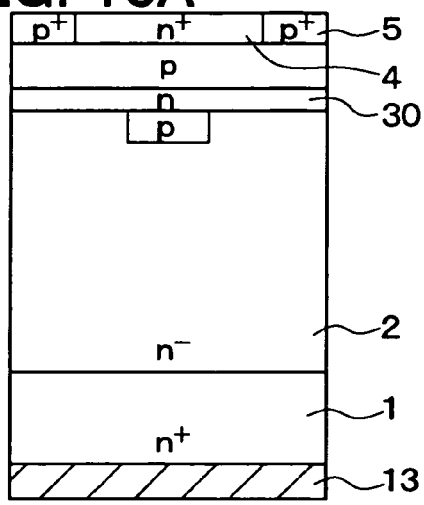
Figure 13B:
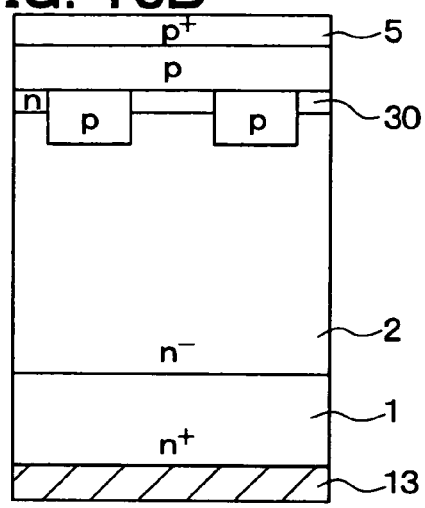
Figure 13C:
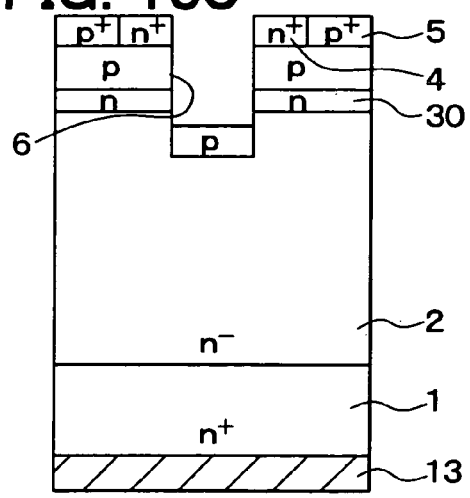
Figure 13D:
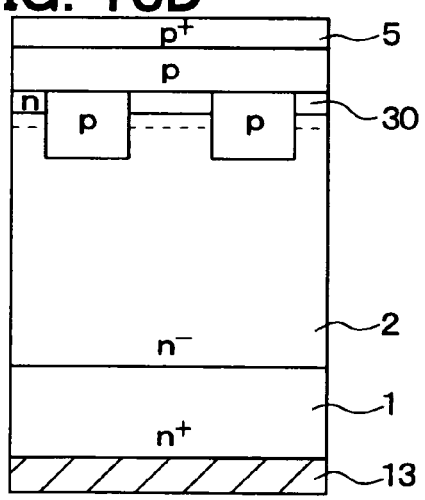
Figure 13E:
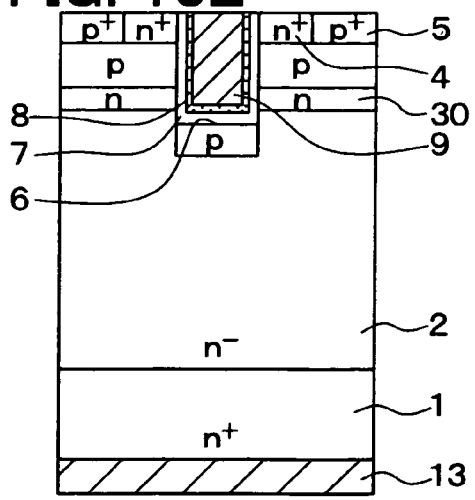
Figure 13F:
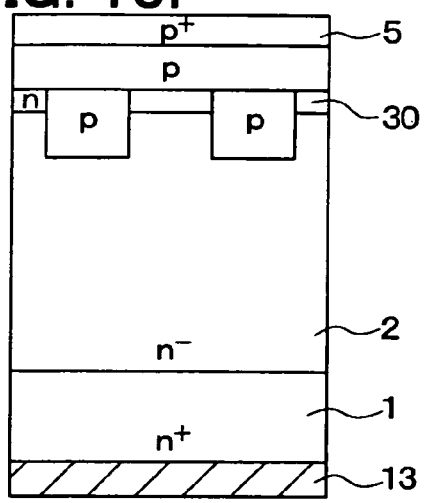

During a process illustrated in FIG. 12A and FIG. 12B, the drain electrode 13 is formed on the rear surface of the N+ type substrate 1 and the N− type drift layer 2 is formed on the front surface of the N+ type substrate 1. Then, the N type current diffusion layer 30 is epitaxially formed on the front surface of the N− type drift layer 2. The impurity concentration of the N type current diffusion layer 30 is greater than the impurity concentration of the N− type drift layer 2. During a process illustrated in FIG. 12C and FIG. 12D, the mask 20 is formed on the front surface of the N type current diffusion layer 30 and the P type deep layer 10 is formed in a manner similar to the process illustrated in FIG. 4C and FIG. 4D. During a process illustrated in FIG. 12E to FIG. 13F, processes similar to the processes illustrated in FIG. 4E to FIG. 5F are performed. In addition, the interlayer insulating layer 12, the contact holes, the source electrode 11, and the gate wiring are formed. Thereby, the MOSFET illustrated in FIG. 10 is formed.

Fourth Embodiment

Figure 14:
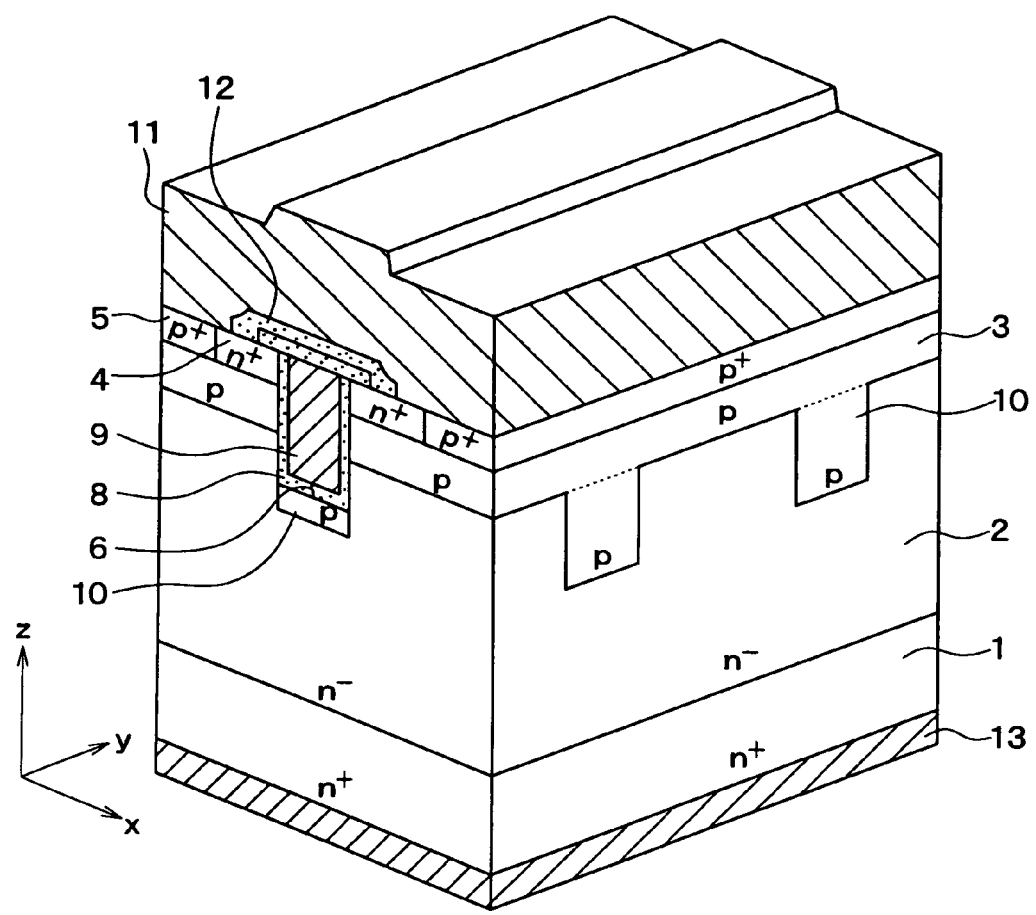
FIG. 14 is a diagram illustrating a perspective cross-sectional view of a MOSFET in an SiC semiconductor device according to a fourth embodiment.

An SiC semiconductor device according to a fourth embodiment will be described with reference to FIG. 14. A MOSFET included in the SiC semiconductor device according to the present embodiment may be an inversion type of the MOSFETs illustrated in FIG. 1, FIG. 6, or FIG. 10. For example, a MOSFET illustrated in FIG. 14 is an inversion type of the MOSFET illustrated in FIG. 1.

In the MOSFET according to the present embodiment, the N type channel layer 7 illustrated in FIG. 1 is not provided and the gate oxide layer 8 is formed on the surface of the trench 6. Thus, the gate oxide layer 8 is in contact with the P type base region 3 and the N+ type source region 4 at the sidewall of the trench 6.

When the gate voltage is applied to the gate electrode 9, a portion of the P type base region 3 in contact with the gate oxide layer 8 becomes an inversion channel and electric current flows between the source electrode 11 and the drain electrode 13.

The MOSFET according to the present embodiment includes the P type deep layer 10. When a drain voltage having a high voltage is applied to the present MOSFET, depletion layers at PN junctions between the P type deep layer 10 and the N− type drift layer 2 expand toward the N− type drift layer 2. Thus, a high voltage due to the drain voltage is restricted from entering the gate oxide layer 8. Thereby, an electric field concentration in the gate oxide layer 8, especially, the electric field concentration in the gate oxide layer 8 at the bottom portion of the trench 6 can be reduced. As a result, the gate oxide layer 8 is restricted from being damaged.

The present MOSFET can be manufactured in a manner similar to the above-described manufacturing process. In the present case, the channel layer 7 is not provided and the gate oxide layer 8 is formed on the surface of the trench 6.

Other Embodiments

Each of the SiC semiconductor devices according to the first to fourth embodiments includes the N channel MOSFETs in which a first conductivity type is an N type and a second conductivity type is a P type. Alternatively, each of the SiC semiconductor devices may include P channel MOSFETs in which the conductivity types are reversed. Alternatively, each of the SiC semiconductor devices may include insulated gate bipolar transistors (IGBTs) each having a trench gate structure. In a case where the above-described SiC semiconductor devices include the IGBTs, the conductivity type of the N+ type substrate 1 is changed from the N conductivity type to the P conductivity type. Other structure and a manufacturing method are similar to the above-described embodiments.

In the first to fourth embodiments, the P type base region 3 and the N+ type source region 4 are formed before providing the trench 6. Alternatively, the P type base region 3 and the N+ type source region 4 may be formed by an ion implantation after forming the trench 6. In a case where the N+ type source region 4 in the first to third embodiments is formed by the ion implantation, the N+ type source region 4 may be in contact with the gate oxide layer 8. In a case where the P type base region 3 is formed by the ion implantation, the P type base region 3 can be separated from the sidewall of the trench 6. Thus, the N− type drift layer 2 that remains between the sidewall of the trench 6 and the P type base region 3 can be used as the N type channel layer 7. The P type base region 3 and the N+ type source region 4 may be formed by an ion implantation after forming the trench 6.

In the first to fourth embodiments, the N+ type source region 4 and the P+ type body layer 5 are formed by the ion implantation. Alternatively, the N+ type source region 4 and the P+ type body layer 5 may be epitaxially formed.

In the first to fourth embodiments, the P type base region 3 is electrically coupled with the source electrode 11 through the P+ type body layer 5. The P+ type body layer 5 may be a contact part and the P type base region 3 may be electrically coupled with the source electrode 11 through the contact part. In the first to fourth embodiments, the gate oxide layer 8 formed by the thermal oxidation is provided as an example of a gate insulating layer. Alternatively, the gate insulating layer may be an oxide layer formed by another method or a nitride layer, for example. The drain electrode 13 may be formed after forming the source electrode 11.

The impurity concentration of the N type current diffusion layer 30 may be equal to the impurity concentration of the N− type drift layer 2. In the present case, the trench 6 is formed after forming the N type current diffusion layer 30 and a position of the bottom portion of the trench 6 is higher than a case where the N type current diffusion layer 30 is not provided. Thus, the position of the P type deep layer 10 is set be deeper than the bottom portion of the trench 6 more effectively, the electric field relaxing effect at the bottom portion of the trench 6 can be improved compared with the first embodiment.

In the first to fourth embodiments, an upper-surface shape of the P type deep layer 10 is formed into the lattice pattern and each of the lattices has an approximately square shape. That is, the first direction and the second direction are inclined at about 45 degrees to the longitudinal direction of the trenches 6 in opposite directions. The SiC semiconductor devices can have the above-described effects as long as the first direction and the second direction are inclined at the same angle to the longitudinal direction of the trenches 6 in opposite directions. In such a case, each of the lattices has a rhombus shape.

Figure 15:
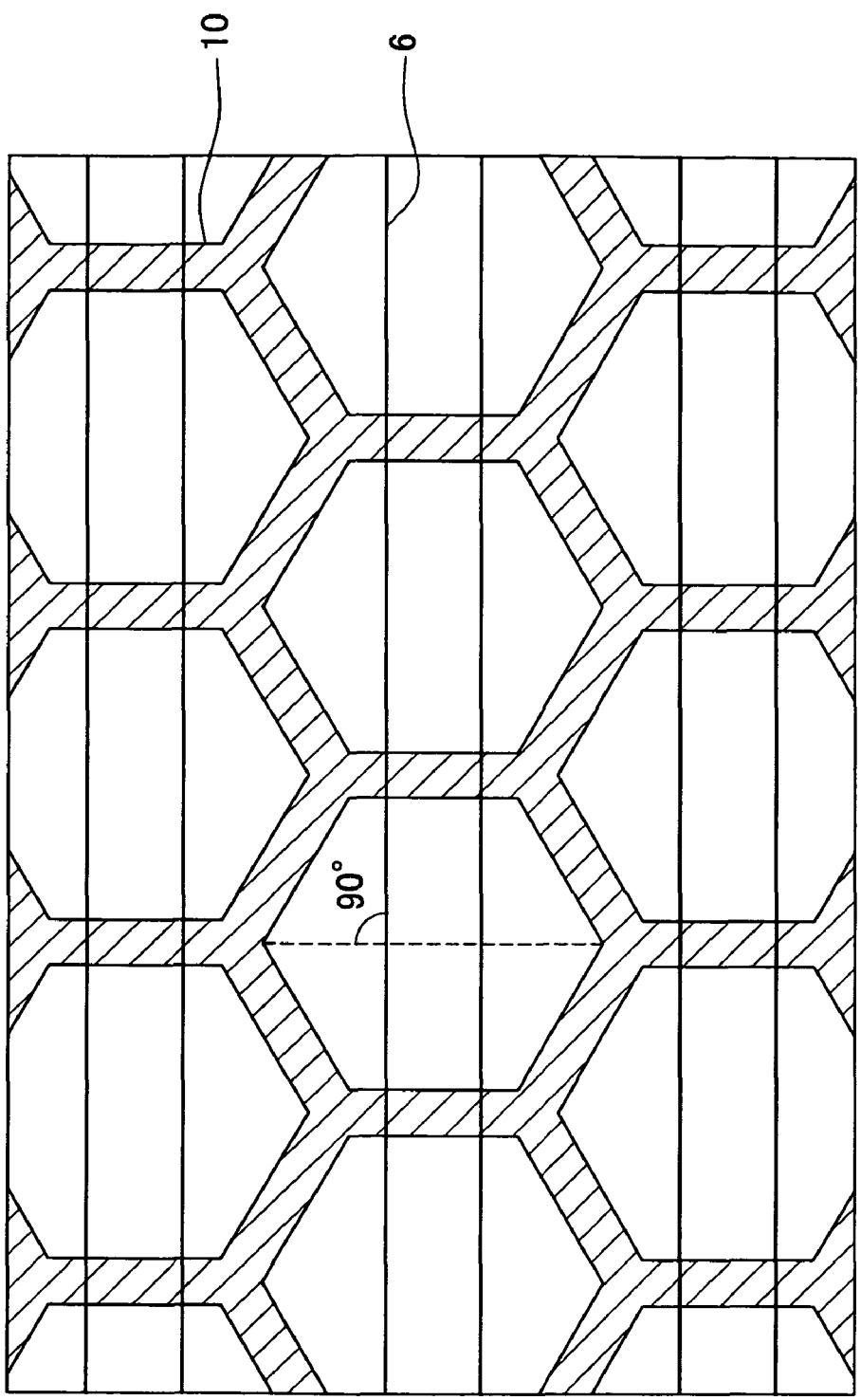
FIG. 15 is a diagram illustrating a layout of a deep layer and trenches according to a modification.

Alternatively, the P type deep layer 10 may be formed into a honeycomb pattern including a plurality of hexagonal shapes, as illustrated in FIG. 15. In such a case, the above-described effects can be obtained if one of diagonal lines passing through a center of the hexagonal shape is approximately perpendicular to the longitudinal direction of the trenches 6.

When an orientation of a crystal face is described, it is originally required for attaching a bar above a desired figure. However, the bar is attached before the figure in the present application.

What is claimed is:
1. A silicon carbide semiconductor device comprising:
   a substrate made of silicon carbide, the substrate having one of a first conductivity type and a second conductivity type, the substrate having first and second opposing surfaces;
   a drift layer located on the first surface of the substrate, the drift layer made of silicon carbide, the drift layer having the first conductivity type and having an impurity concentration less than an impurity concentration of the substrate;
   a base region located on the drift layer, the base region made of silicon carbide and having the second conductivity type;
   a source region located on the base region, the source region made of silicon carbide, the source region having the first conductive type and having an impurity concentration greater than the impurity concentration of the drift layer;
   a trench extending to a depth deeper than the base region and the source region, the trench being sandwiched by each of the base region and source region;
   a channel layer located on a sidewall of the trench, the channel layer made of silicon carbide and having the first conductivity type;
   a gate insulating layer located on a surface of the channel layer so as to be apart from the base region;
   a gate electrode located on the gate insulating layer in the trench;
   a source electrode electrically coupled with the source region and the base region;
   a drain electrode located on the second surface of the substrate; and
   a deep layer located under the base region and extending to a depth deeper than the trench, the deep layer having the second conductivity type, the deep layer formed into a lattice pattern in such a manner that sections of the deep layer are formed along a first direction, the other sections of the deep layer are formed along a second direction, and the first direction and second direction are inclined at an approximately same angle to the sidewall of the trench in opposite directions, wherein
   an accumulation channel is provided at the channel layer on the sidewall of the trench and electric current flows between the source electrode and the drain electrode through the source region and the drift layer by controlling a voltage applied to the gate electrode.

2. The silicon carbide semiconductor device according to claim 1, wherein
   the deep layer has an impurity concentration greater than or equal to an impurity concentration of the base region.

3. The silicon carbide semiconductor device according to claim 1, further comprising
   a current diffusion layer located between the base region and the drift layer, wherein:
   the current diffusion layer is made of silicon carbide and has the first conductivity type; and
   the current diffusion layer has an impurity concentration greater than or equal to the impurity concentration of the drift layer.

4. The silicon carbide semiconductor device according to claim 3, wherein
   the trench penetrating the current diffusion layer to the drift layer.

5. The silicon carbide semiconductor device according to claim 3, wherein
   the deep layer penetrating the current diffusion layer and being in contact with the base region.

6. The silicon carbide semiconductor device according to claim 1, wherein the impurity concentration of the drift layer decreases in a direction from the substrate toward the base region.

7. A silicon carbide semiconductor device comprising:
a substrate made of silicon carbide, the substrate having one of a first conductivity type and a second conductivity type, the substrate having first and second opposing surfaces;
a drift layer located on the first surface of the substrate, the drift layer made of silicon carbide, the drift layer having the first conductivity type and having an impurity concentration less than an impurity concentration of the substrate;
a base region located on the drift layer, the base region made of silicon carbide and having the second conductivity type;
a source region located on the base region, the source region made of silicon carbide, the source region having the first conductive type and having an impurity concentration greater than the impurity concentration of the drift layer;
a trench extending to a depth deeper than the base region and the source region, the trench being sandwiched by each of the base region and source region;
a channel layer located on a sidewall of the trench, the channel layer made of silicon carbide and having the first conductivity type;
a gate insulating layer located on a surface of the channel layer so as to be apart from the base region;
a gate electrode located on the gate insulating layer in the trench;
a source electrode electrically coupled with the source region and the base region;
a drain electrode located on the second surface of the substrate; and
a deep layer located under the base region and extending to a depth deeper than the trench, the deep layer having the second conductivity type, the deep layer formed into a honeycomb pattern including a plurality of hexagonal shapes, a diagonal line passing through a center of each of the plurality of hexagonal shapes being approximately perpendicular to the sidewall of the trench, wherein
an accumulation channel is provided at the channel layer on the sidewall of the trench and electric current flows between the source electrode and the drain electrode through the source region and the drift layer by controlling a voltage applied to the gate electrode.

8. A silicon carbide semiconductor device comprising:
a substrate made of silicon carbide, the substrate having one of a first conductivity type and a second conductivity type, the substrate having first and second opposing surfaces;
a drift layer located on the first surface of the substrate, the drift layer made of silicon carbide, the drift layer having the first conductivity type and having an impurity concentration less than an impurity concentration of the substrate;
a base region located on the drift layer, the base region made of silicon carbide and having the second conductivity type;
a source region located on the base region, the source region made of silicon carbide, the source region having the first conductive type and having an impurity concentration greater than the impurity concentration of the drift layer;
a trench extending to a depth deeper than the base region and the source region, the trench being sandwiched by each of the base region and source region;
a gate insulating layer located on a surface of the trench;
a gate electrode located on the gate insulating layer in the trench;
a source electrode electrically coupled with the source region and the base region;
a drain electrode located on the second surface of the substrate; and
a deep layer located under the base region and extending to a depth deeper than the trench, the deep layer having the second conductivity type, the deep layer formed into a lattice pattern in such a manner that sections of the deep layer are formed along a first direction, the other sections of the deep layer are formed along a second direction, and the first direction and second direction are inclined at an approximately same angle to the sidewall of the trench in opposite directions, wherein
an inversion channel is provided at a surface portion of the base region located on a sidewall of the trench and electric current flows between the source electrode and the drain electrode through the source region and the drift layer by controlling a voltage applied to the gate electrode.

9. A silicon carbide semiconductor device comprising:
a substrate made of silicon carbide, the substrate having one of a first conductivity type and a second conductivity type, the substrate having first and second opposing surfaces;
a drift layer located on the first surface of the substrate, the drift layer made of silicon carbide, the drift layer having the first conductivity type and having an impurity concentration less than an impurity concentration of the substrate;
a base region located on the drift layer, the base region made of silicon carbide and having the second conductivity type;
a source region located on the base region, the source region made of silicon carbide, the source region having the first conductive type and having an impurity concentration greater than the impurity concentration of the drift layer;
a trench extending to a depth deeper than the base region and the source region, the trench being sandwiched by each of the base region and source region;
a gate insulating layer located on a surface of the trench;
a gate electrode located on the gate insulating layer in the trench;
a source electrode electrically coupled with the source region and the base region;
a drain electrode located on the second surface of the substrate; and
a deep layer located under the base region and extending to a depth deeper than the trench, the deep layer having the second conductivity type, the deep layer formed into a honeycomb pattern including a plurality of hexagonal shapes, a diagonal line passing through a center of each of the plurality of hexagonal shapes being approximately perpendicular to the sidewall of the trench, wherein
an inversion channel is provided at a surface portion of the base region located on a sidewall of the trench and electric current flows between the source electrode and the drain electrode through the source region and the drift layer by controlling a voltage applied to the gate electrode.

* * * * *